United States Patent
Miyamoto

(10) Patent No.: US 6,891,416 B2
(45) Date of Patent: May 10, 2005

(54) TIMING GENERATION CIRCUIT AND METHOD FOR TIMING GENERATION

(75) Inventor: Yasuo Miyamoto, Tenri (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 0 days.

(21) Appl. No.: 10/423,731

(22) Filed: Apr. 25, 2003

(65) Prior Publication Data

US 2003/0214339 A1 Nov. 20, 2003

Related U.S. Application Data

(62) Division of application No. 09/501,132, filed on Feb. 9, 2000, now Pat. No. 6,573,776.

(30) Foreign Application Priority Data

| Mar. 1, 1999 | (JP) | 11-053370 |
| Aug. 27, 1999 | (JP) | 11-242304 |

(51) Int. Cl.[7] ............................................. H03L 7/00
(52) U.S. Cl. ..................................... 327/161; 327/158
(58) Field of Search ................................ 327/156, 158, 327/161, 276

(56) References Cited

U.S. PATENT DOCUMENTS

| 4,330,750 A | * | 5/1982 | Mayor | 327/276 |
| 5,668,491 A | * | 9/1997 | Higashisaka et al. | 327/277 |
| 5,744,991 A | * | 4/1998 | Jefferson et al. | 327/158 |
| 5,777,520 A | * | 7/1998 | Kawakami | 331/1 R |
| 5,923,715 A | * | 7/1999 | Ono | 375/376 |
| 6,049,239 A | * | 4/2000 | Eto et al. | 327/158 |

FOREIGN PATENT DOCUMENTS

| JP | 61-047573 | 3/1986 |
| JP | 63-249890 | 10/1988 |
| JP | 03-035613 | 2/1991 |
| JP | 04-196813 | 7/1992 |
| JP | 05-035282 | 2/1993 |
| JP | 07-334142 | 12/1995 |
| JP | 08-163006 | 6/1996 |
| JP | 09121147 | 5/1997 |
| JP | 10-093406 | 4/1998 |
| JP | 10-209828 | 8/1998 |

OTHER PUBLICATIONS

Japanese Office Action mailed Jun. 7, 2004 directed to Japanese Patent Application 11-242304, filed on Aug. 27, 1999, two pages.

* cited by examiner

*Primary Examiner*—Quan Tra
(74) *Attorney, Agent, or Firm*—Morrison & Foerster LLP

(57) ABSTRACT

A timing generation circuit includes: a delay section including a plurality of delay circuits for sequentially transferring a clock signal therethrough, wherein the clock signal is delayed by a predetermined amount of time before being output from one of the plurality of delay circuits in the delay section; and a control circuit for changing a delay time of at least one of the plurality of delay circuits in the delay section in accordance with a frequency of the clock signal.

26 Claims, 19 Drawing Sheets

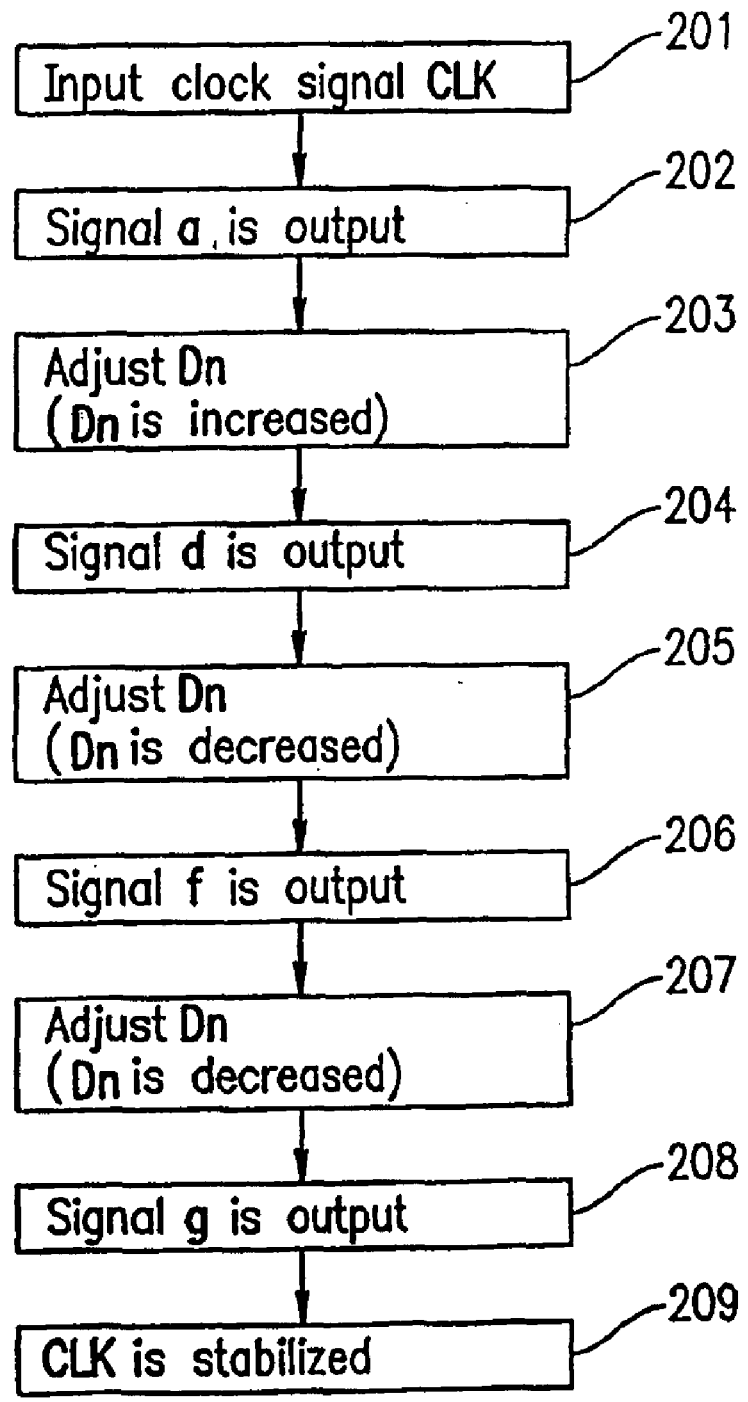

*(Former Upper Delay Circuit)*

*(Former Upper Delay Circuit)*

*(Former Lower Delay Circuit)*

*(Former Lower Delay Circuit)*

*(Former Upper Delay Circuit)*

*(Former Lower Delay Circuit)*

TIMING GENERATION CIRCUIT AND METHOD FOR TIMING GENERATION

CROSS-REFERENCE TO RELATED APPLICATIONS

This application is a Divisional of U.S. patent application Ser. No. 09/501,132 filed on Feb. 9, 2000, now U.S. Pat. No. 6,573,776, which claims the benefit of Japanese Patent Application No. 11-053370, filed on Mar. 1, 1999 and Japanese Patent Application No. 11-242304 filed on Aug. 27, 1999, the contents of each of which are incorporated herein by reference in their entirety.

BACKGROUND OF THE INVENTION

1. Field of the Invention

The present invention relates to a timing generation circuit for adjusting the timing of a clock signal used in a semiconductor integrated circuit. In particular, the present invention relates to a timing generation circuit incorporating a DLL (delayed logic loop) and a method for timing generation.

2. Description of the Related Art

A conventional timing generation circuit incorporating a DLL may be constructed as shown in FIG. 8, for example. With reference to FIG. 8, when an input buffer 101 receives a clock signal CLK at its input, the input buffer 101 generates a signal A by delaying the clock signal CLK by a delay time d1, and the signal A is output to a timing compensation section 102. The timing compensation section 102 further delays the signal A by an appropriate amount of time, and transfers the resultant signal to an output buffer 103. The output buffer 103 further delays the signal A by a delay time d2, and outputs a clock signal ICLK. As a result, the output clock signal ICLK is delayed by one cycle relative to the input clock signal CLK, so that both clock signal CLK and ICLK synchronize with each other, as described below in more detail.

The timing compensation section 102 is employed for the following reason. If the timing compensation section 102 is omitted, so that the clock signal CLK is input to the input buffer 101 and the clock signal ICLK is output from the output buffer 103, then the clock signal ICLK will lag behind the clock signal CLK by a sum of delay times d1+d2, so that the clock signal CLK and the clock signal ICLK are no longer in synchronization with each other. Accordingly, the timing compensation section 102 is employed to ensure that the sum of delay times d1+d2 apparently equals zero.

The timing compensation section 102 includes a delay circuit 111, an upper delay line 112 having a plurality of upper delay circuits 112-0 to 112-7, and a lower delay line 113 having a plurality of lower delay circuits 113-0 to 113-7. The delay circuit 111, the upper delay line 112, and the lower delay line 113 together compose a DLL (delayed logic loop).

The delay circuit 111 receives the signal A, which has been delayed in the input buffer 101 by the delay time d1 relative to the clock signal CLK. The delay circuit 111 further delays the signal A by a delay time which is equal to d1+d2 so as to generate a signal B, which in turn is applied to the upper delay line 112. Each of the upper delay circuits 112-0 to 112-7 of the upper delay line 112, all of which have the same compensatory delay time, delays the signal B by its respective compensatory delay time as the signal B is transferred downstream.

The lower delay circuits 113-0 to 113-7 of the lower delay line 113 have the same compensatory delay time as that of the upper delay circuits 112-0 to 112-7 of the upper delay line 112. Upon receiving the signal A, each of the lower delay circuits 113-0 to 113-7 of the lower delay line 113 delays the signal A by its respective compensatory delay time as the signal A is transferred downstream.

When the signal A which is output from the input buffer 101 comes to a next rising edge, the signal B rises in one of the upper delay circuits 112-0 to 112-7 of the upper delay line 112. In response to this, one of signals a, b, c, d, e, f, g, and h is output to a corresponding one of the lower delay circuits 113-0 to 113-7 of the lower delay line 113. Further in response thereto, the corresponding one of the lower delay circuits 113-0 to 113-7 of the lower delay line 113 outputs the signal A to the output buffer 103.

The operation of the above-described timing generation circuit will now be described with reference to a timing chart shown in FIG. 9.

The delay time from a rising edge of the signal A to a rising edge of the signal B is equal to d1+d2, i.e., the delay time applied by the delay circuit 111.

Assuming that one cycle of the clock signal CLK is Tck, the delay time from a rising edge of the signal B to the next rising edge of the signal A is equal to Tck −(d1+d2).

After the rising edge of the signal B is received by the upper delay line 112, the signal B may rise in, e.g., the upper delay circuit 112-3 of the upper delay line 112 responsive to the next rising edge of the signal A. In this case, the signal d is output from the upper delay circuit 112-3 and applied to the lower delay circuit 113-3 of the lower delay line 113. As a result, the signal A is output from the lower delay circuit 113-3.

During the aforementioned process, the rising edge of the signal B is delayed by the upper delay circuits 112-0 to 112-3 of the upper delay line 112 until the next rising edge of the signal A. Therefore, the rising edge of the signal B has been delayed by a delay time which is equal to Tck−(d1+d2). The lower delay circuit 113-0 to 113-3 of the lower delay line 113, which essentially has the same structure as the upper delay line 112, also apply a delay time which is equal to Tck −(d1+d2). Accordingly, the signal A from the input buffer 101 will have been delayed in the lower delay circuits 113-0 to 113-3 of the lower delay line 113 by the delay time Tck−(d1+d2) before being applied to the output buffer 103.

Accordingly, the total delay time from the input buffer 101 to the output buffer 103 is equal to d1+Tck −(d1+d2)+d2=Tck. In other words, the clock signal CLK which is input to the input buffer 101 is delayed by one complete cycle Tck of the clock signal CLK before being output from the output buffer 103 as the clock signal ICLK. Thus, the clock signal CLK which is input to the input buffer 101 and the clock signal ICLK which is output from the output buffer 103 are synchronized with each other.

By adjusting the delay time (d1+d2) between the signals A and B, it is also possible to prescribe a negative delay time. For example, if a delay time (d1+d2−d3) is set in the delay circuit 111 instead of (d1+d2), the clock signal ICLK which is output from the output buffer 103 will have been delayed by a delay time −d3 (see Japanese Laid-Open Patent Publication No. 9-121147).

In another conventional example illustrated in FIG. 18, a variable delay subsection 123 is inserted between an input circuit 121 and an output circuit 122. A phase comparator circuit 124 adjusts the delay time in the variable delay subsection 123 so as to maintain synchronization between a clock signal CLK which is input to the input circuit 121 and a clock signal ICLK which is output from the output circuit 122. Specifically, the phase comparator circuit 124 adjusts the delay time in the variable delay subsection 123 so that a signal A from the input circuit 121, which has been delayed by a delay time d1, stays in synchronization with a signal B from a dummy input circuit 125 which has also been delayed by d1. As a result, the variable delay subsection 123 outputs a signal C, which is delayed by a delay time −d2, to the output circuit 122. The signal C is output from the output circuit 122 as the clock signal ICLK.

In the aforementioned conventional timing generation circuit shown in FIG. 8, the delay time in the upper delay circuits 112-0 to 112-7 of the upper delay line 112 and the lower delay circuits 113-0 to 113-7 of the lower delay line 113 defines the minimum unit delay time which allows for adjustment. As this unit delay time is decreased, the synchronization between the respective clock signals can be adjusted with a higher accuracy. For example, if the unit delay time in the respective upper delay circuits 112-0 to 112-7 and the respective lower delay circuits 113-0 to 113-7 is 1 ns, then the timing of the clock signals can be adjusted on the order of 1 ns. On the other hand, if the unit delay time in the respective upper delay circuits 112-0 to 112-7 and the lower delay circuits 113-0 to 113-7 is 0.1 ns, then the timing of the clock signals can be adjusted on the order of 0.1 ns. Thus, it is preferable to minimize the unit delay time in order to maintain highly accurate clock signal synchronization.

Moreover, the adjustable range of the delay time for the clock signals increases as more stages (i.e., delay circuits) are incorporated in the upper delay line 112 and the lower delay line 113 because the available delay time is defined by the maximum delay time in the upper delay line 112 and the lower delay line 113. However, the DLL will occupy a larger area in the entire semiconductor IC (integrated circuit) as more stages (i.e., delay circuits) are incorporated in the upper delay line 112 and the lower delay line 113. Therefore, there exists an inevitable limit to the number of stages or upper/lower delay circuits that can be incorporated in the upper delay line 112 and the lower delay line 113, which in turn limits the overall adjustable range of delay time for clock signals.

Furthermore, given a limited number of stages or delay circuits in the upper delay line 112 and the lower delay line 113, the overall adjustable range of delay time for clock signals becomes smaller as the unit delay time in the respective delay circuits is decreased. Given a limited overall adjustable range of delay time for clock signals, it is particularly difficult to adjust the synchronization of a relatively low frequency clock signal because a relatively low frequency clock signal has a relatively long cycle which may exceed the maximum delay time in the upper delay line 112 and the lower delay line 113. In fact, in synchronous DRAMs of a DDR (double data rate) type which incorporate DLLs, the DLLs are inactivated when the clock signal goes lower than a predetermined frequency because the DLLs are no longer of use.

Thus, the aforementioned conventional timing generation circuit has two incompatible needs: a need to minimize the unit delay time in the respective delay circuits in order to maintain highly accurate clock signal synchronization, and a need to adjust the synchronization of a clock signal having a relatively long cycle.

With the conventional apparatus shown in FIG. 18, in which the variable delay subsection 123 includes a sequence of delay circuits, it is also difficult to reconcile highly accurate clock signal synchronization with synchronization adjustment for a clock signal having a relatively long cycle.

SUMMARY OF THE INVENTION

A timing generation circuit according to the present invention includes: a delay section including a plurality of delay circuits for sequentially transferring a clock signal therethrough, wherein the clock signal is delayed by a predetermined amount of time before being output from one of the plurality of delay circuits in the delay section; and a control circuit for changing a delay time of at least one of the plurality of delay circuits in the delay section in accordance with a frequency of the clock signal.

Alternatively, a timing generation circuit according to the present invention includes: a delay section including a plurality of delay circuits for sequentially transferring a clock signal therethrough, wherein the clock signal is delayed by a predetermined amount of time before being output from one of the plurality of delay circuits in the delay section; a detection section for detecting a frequency of the clock signal; and a control circuit for changing a delay time of at least one of the plurality of delay circuits in the delay section in accordance with the frequency of the clock signal detected by the detection section.

In another embodiment of the invention, the plurality of delay circuits in the delay section include former delay circuits and latter delay circuits, and the delay time of the former delay circuits is changed by the control circuit, and the delay time of the latter delay circuits is fixed.

In still another embodiment of the invention, the detection section includes a plurality of delay circuits for sequentially transferring the clock signal therethrough, and, when a pulse of the clock signal which has been delayed by at least one clock signal cycle is output from one of the plurality of delay circuits in the delay section, the detection section detects the frequency of the clock signal based on which one of the plurality of delay circuits in the detection section the pulse of the clock signal is output from.

In still another embodiment of the invention, at least one of the plurality of delay circuits in the delay section whose delay time is changed by the control circuit comprises an inverter, and the control circuit changes the delay time of the at least one delay circuit by changing a current which is supplied to the inverter comprised in the at least one delay circuit.

In still another embodiment of the invention, at least one of the plurality of delay circuits in the delay section whose delay time is changed by the control circuit comprises an inverter, and the control circuit changes the delay time of the at least one delay circuit by changing a voltage which is applied to the inverter comprised in the at least one delay circuit.

In still another embodiment of the invention, at least one of the plurality of delay circuits in the delay section whose delay time is changed by the control circuit comprises an inverter and a passive element to be driven by the inverter, and the control circuit changes the delay time of the at least one delay circuit by changing a parameter value of the passive element comprised in the at least one delay circuit.

In another aspect of the invention, there is provided a method for timing generation, including the steps of: sequentially transferring a clock signal through delay section including a plurality of delay circuits so as to delay the clock signal by a predetermined amount of time; outputting the delayed clock signal from one of the plurality of delay circuits in the delay section; and changing a delay time of at least one of the plurality of delay circuits in the delay section in accordance with a frequency of the clock signal.

Alternatively, a timing generation circuit according to the present invention includes a delay section for delaying a clock signal by a predetermined amount of time before the clock signal is output, wherein the delay section includes: a first delay subsection having a relatively long delay time for performing a coarse delay time adjustment; and a second delay subsection having a relatively short delay time for performing a finer delay time adjustment.

In one embodiment of the invention, the timing generation circuit further includes: a frequency detection circuit for adjusting the relatively long delay time of the first delay subsection based on a frequency of the clock signal; and a phase comparator circuit for adjusting the relatively short delay time of the second delay subsection based on a phase shift of the clock signal.

In another embodiment of the invention, the timing generation circuit further includes: a frequency detection circuit for adjusting the relatively long delay time of the first delay subsection so as to approximate a target delay time based on a frequency of the clock signal; and a phase comparator circuit for adjusting the relatively short delay time of the second delay subsection so as to equal the target delay time based on a phase shift of the clock signal.

In still another embodiment of the invention, the first delay subsection is provided adjacent to an input node for inputting the clock signal, and the second delay subsection is provided adjacent to an output node for outputting the clock signal.

In still another embodiment of the invention, the first delay subsection includes a plurality of delay circuits for sequentially transferring the clock signal therethrough, and the second delay subsection includes a plurality of delay circuits for sequentially transferring the clock signal therethrough, and the clock signal which is output from either the first delay subsection or the second delay subsection is output from the timing generation circuit.

Alternatively, a timing generation circuit according to the present invention includes a delay section for delaying a clock signal by a predetermined amount of time before the clock signal is output, wherein the delay section includes a plurality of delay subsections having respectively different delay times, and wherein at least one of the plurality of delay subsections performs a coarse delay time adjustment, and at least one of the plurality of delays performs a finer delay time adjustment.

In one embodiment of the invention, the timing generation circuit further includes: a frequency detection circuit for adjusting the delay time of the at least one delay subsection for performing a coarse delay time adjustment, based on a frequency of the clock signal; and a phase comparator circuit for adjusting the delay time of the at least one delay subsection for performing a finer delay time adjustment, based on a phase shift of the clock signal.

In another embodiment of the invention, the at least one delay subsection for performing a coarse delay time adjustment is provided adjacent to an input node for inputting the clock signal, and the at least one delay subsection for performing a finer delay time adjustment is provided adjacent to an output node for outputting the clock signal.

In still another embodiment of the invention, the delay section includes at least three delay subsections, and the at least three delay subsections respectively perform different levels of delay time adjustment, comprising a coarse delay time adjustment, a finer delay time adjustment, and a finest delay time adjustment.

In still another embodiment of the invention, each of the plurality of delay subsections includes a plurality of delay circuits for sequentially transferring the clock signal therethrough, and the clock signal which is output from one of the plurality of delay subsections is output from the timing generation circuit.

Alternatively, a timing generation circuit according to the present invention includes: a delay section for delaying a clock signal by a predetermined amount of time before the clock signal is output, the delay section including: a first delay subsection having a delay time for performing a coarse delay time adjustment; second and third delay subsections having respective delay times for performing a finer delay time adjustment; a frequency detection circuit for adjusting the delay time of the first delay subsection based on a frequency of the clock signal; and a phase comparator circuit for adjusting the delay times of the second and third delay subsections based on a phase shift of the clock signal.

Alternatively, a timing generation circuit according to the present invention includes: a delay section for delaying a clock signal by a predetermined amount of time before the clock signal is output, the delay section including: a first delay subsection having a delay time for performing a coarse delay time adjustment; second and third delay subsections having respective delay times for performing a finer delay time adjustment; a first phase comparator circuit for adjusting the delay time of the first delay subsection based on a phase shift of the clock signal; and a second phase comparator circuit for adjusting the delay times of the second and third delay subsections based on the phase shift of the clock signal.

In one embodiment of the invention, each of the plurality of delay subsections includes a plurality of delay circuits for sequentially transferring the clock signal therethrough, and the clock signal which is output from one of the plurality of delay subsections is output from the timing generation circuit.

In another embodiment of the invention, one of the delay subsections which has a smaller delay time than that of any other delay subsection is prescribed with a delay time equal to a shortest possible delay time permitted in an actual implementation of the timing generation circuit.

In still another embodiment of the invention, the delay section includes a transistor, a capacitor, and a resistor, and the W/L of the transistor, the capacitance, the resistance are optimized so that the delay section is capable of providing an increased delay time without increasing areas occupied by the plurality of delay circuits.

In still another embodiment of the invention, the delay section provides a variable delay time.

In still another embodiment of the invention, a rising or falling edge of the clock signal which has been subjected to the coarse delay time adjustment occurs before a target time, and the rising or falling edge of the clock signal is adjusted through the finer delay time adjustment so as to occur at the target time.

In still another embodiment of the invention, the delay times of the respective delay subsections are prescribed, while taking into consideration any errors in the delay times provided by the respective delay subsections, so that a rising or falling edge of the clock signal which has been subjected to the coarse delay time adjustment occurs before a target time.

Thus, the invention described herein makes possible the advantage of providing a timing generation circuit and a method for timing generation which are capable of highly accurately adjusting clock signal synchronization irrespective of the clock signal frequency, even under constraints on the number of delay circuits.

This and other advantages of the present invention will become apparent to those skilled in the art upon reading and understanding the following detailed description with reference to the accompanying figures.

BRIEF DESCRIPTION OF THE DRAWINGS

FIG. 2 is a flowchart describing the operation of the timing generation circuit of FIG. 1.

DESCRIPTION OF THE PREFERRED EMBODIMENTS

Hereinafter, the present invention will be described by way of examples, with reference to the accompanying figures.

EXAMPLE 1

Figure 1:
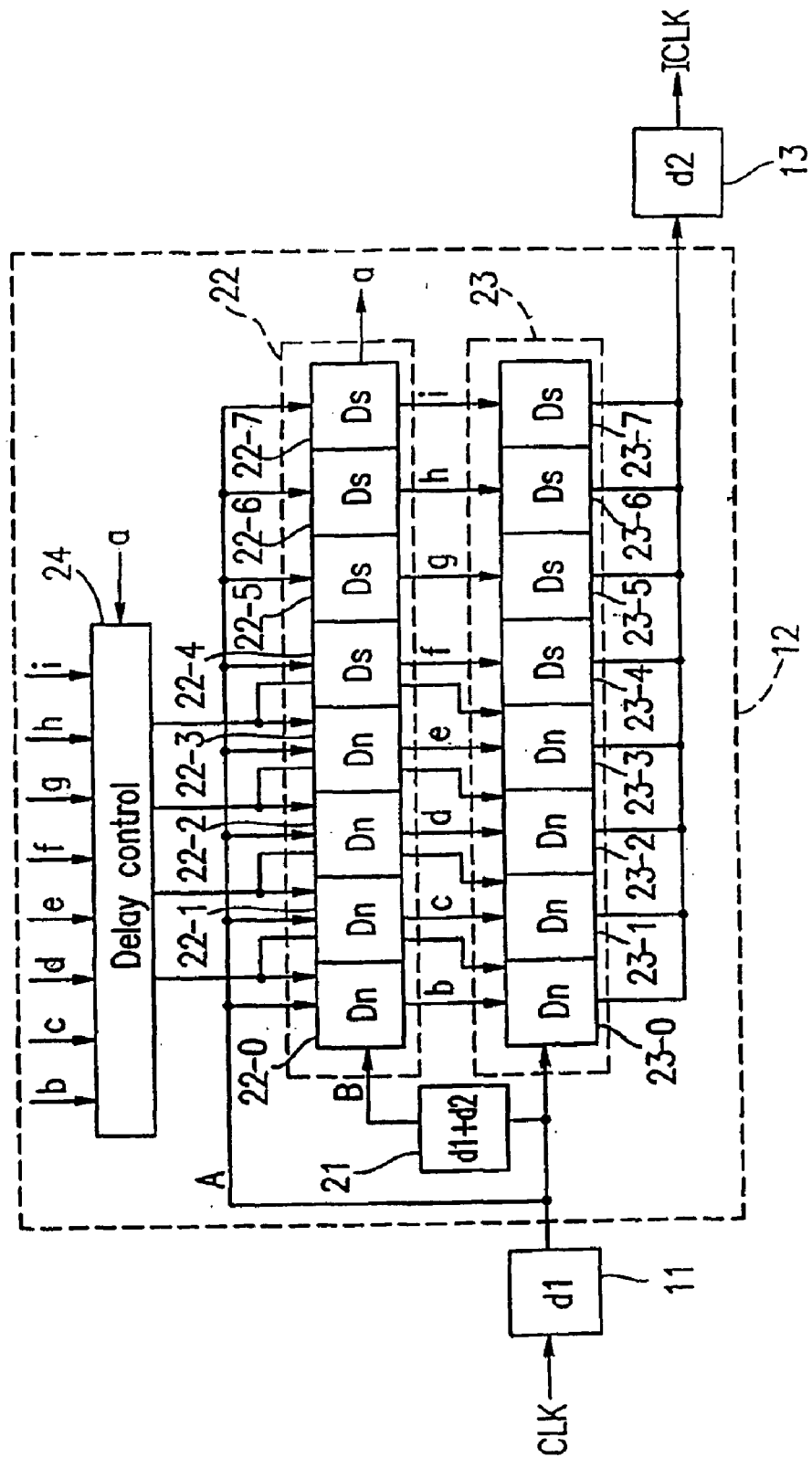
FIG. 1 is a block diagram illustrating a timing generation circuit according to Example 1 of the present invention.

FIG. 1 is a block diagram illustrating a timing generation circuit according to Example 1 of the present invention. With reference to FIG. 1, when an input buffer 11 receives a clock signal CLK at its input, the input buffer 11 generates a signal A by delaying the clock signal CLK by a delay time d1, and the signal A is output to a timing compensation section 12. The timing compensation section 12 further delays the signal A by an appropriate amount of time, and transfers the resultant signal to an output buffer 13. The output buffer 13 further delays the signal A by a delay time d2, and outputs a clock signal ICLK. As a result, the output clock signal ICLK is delayed by one cycle relative to the input clock signal CLK, so that both clock signal CLK and ICLK synchronize with each other, as described below in more detail.

The timing compensation section 12 includes a delay circuit 21, an upper delay line 22 having a plurality of upper delay circuits 22-0 to 22-7, a lower delay line 23 having a plurality of lower delay circuits 23-0 to 23-7, and a delay control circuit 24. The delay circuit 21, the upper delay line 22, and the lower delay line 23 together compose a DLL (delayed logic loop).

The delay circuit 21 receives the signal A, which has been delayed in the input buffer circuit 11 by the delay time d1 relative to the clock signal CLK. The delay circuit 21 further delays the signal A by a delay time which is equal to d1+d2 so as to generate a signal B, which in turn is applied to the upper delay line 22.

The upper delay circuits 22-0 to 22-3 (hereinafter collectively referred to as the "former upper delay circuits") of the upper delay line 22 each have a first compensatory delay time which can be varied by the delay control circuit 24. Each of the former upper delay circuits 22-0 to 22-3 delays the signal B by the first compensatory delay time as the signal B is transferred downstream. The upper delay circuits 22-4 to 22-7 (hereinafter collectively referred to as the "latter upper delay circuits") of the upper delay line 22 each have a fixed, sufficiently short second compensatory delay time for attaining highly accurate clock signal synchronization. Each of the latter upper delay circuits 22-4 to 22-7 delays the signal B by the second compensatory delay time as the signal B is transferred downstream.

The lower delay circuits 23-0 to 23-3 (hereinafter collectively referred to as the "former lower delay circuits") of the lower delay line 23 each have the aforementioned first compensatory delay time which can be varied by the delay control circuit 24. Each of the former lower delay circuits 23-0 to 23-3 delays the signal A by the first compensatory delay time as the signal A is transferred downstream. The lower delay circuits 23-4 to 23-7 (hereinafter collectively referred to as the "latter lower delay circuits") of the lower delay line 23 each have the same second compensatory delay time as that of the latter upper delay circuits 22-4 to 22-7 of the upper delay line 22. Each of the latter lower delay circuits 23-4 to 23-7 delays the signal A by the second compensatory delay time as the signal A is transferred downstream.

The delay control circuit 24, which changes the first compensatory delay time, equally applies the changed first compensatory delay time to both the former upper delay circuits 22-0 to 22-3 of the upper delay line 22 and the former lower delay circuits 23-0 to 23-3 of the lower delay line 23.

When the signal A which is output from the input buffer 11 and applied to the upper delay circuits 22-0 to 22-7 of the upper delay line 22 comes to a next rising edge, the signal B rises in one of the upper delay circuits 22-0 to 22-7 of the upper delay line 22. In response to this, one of signals b, c, d, e, f, g, h, and i is output to a corresponding one of the lower delay circuits 23-0 to 23-7 of the lower delay line 23.

Further in response thereto, the corresponding one of the lower delay circuits 23-0 to 23-7 of the lower delay line 23 outputs the signal A to the output buffer 13.

The delay control circuit 24 receives one of the signals a, b, c, d, e, f, g, h, and i from the upper delay circuits 22-0 to 22-7 of the upper delay line 22. Depending on which one of the signals a to i is received, the delay control circuit 24 accordingly adjusts the first compensatory delay time of the former upper delay circuits 22-0 to 22-3 of the upper delay line 22 and the former lower delay circuits 23-0 to 23-3 of the lower delay line 23.

Figure 8:
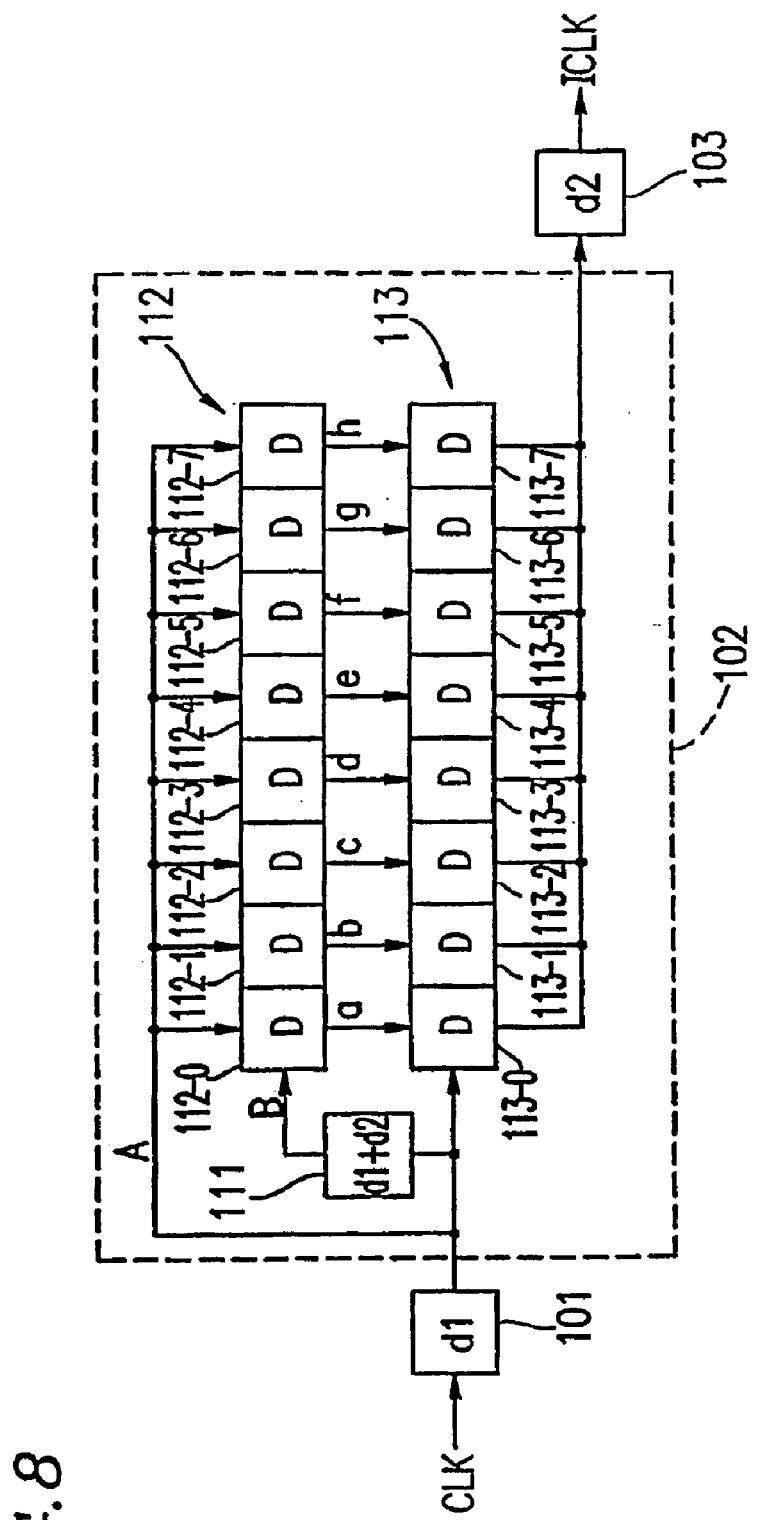
FIG. 8 is a block diagram illustrating a conventional timing generation circuit.
Figure 9:
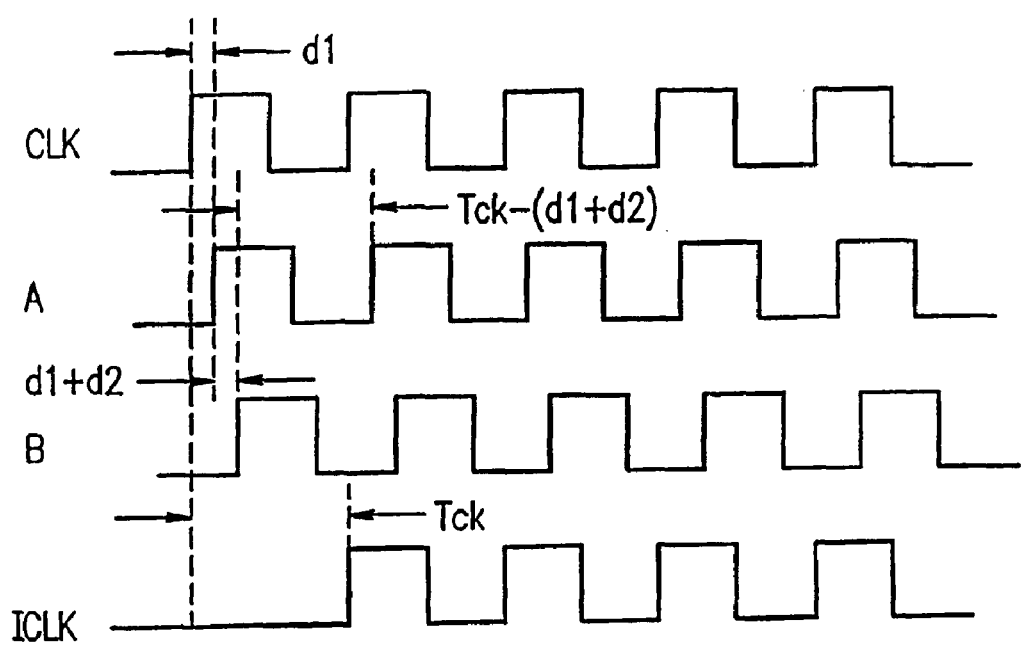
FIG. 9 is a timing diagram illustrating the timing of various signals in the circuit of FIG. 8.

The fundamental operation of the timing generation circuit according to the present invention, except for the function of the delay control circuit 24, is similar to the operation of the conventional circuit shown in FIG. 8.

After the rising edge of the signal B is received by the upper delay line 22, the signal B may rise in, e.g., the upper delay circuit 22-5 of the upper delay line 22 responsive to the next rising edge of the signal A. In this case, the signal g is output from the upper delay circuit 22-5 and applied to the lower delay circuit 23-5 of the lower delay line 23. As a result, the signal A is output from the lower delay circuit 23-5.

During the aforementioned process, the rising edge of the signal B is delayed by the upper delay circuits 22-0 to 22-5 of the upper delay line 22 by a delay time which is equal to Tck−(d1+d2), where Tck is one cycle of the clock signal CLK. The lower delay circuit 23-0 to 23-5 of the lower delay line 23, which essentially has the same structure as the upper delay line 22, also apply a delay time which is equal to Tck −(d1+d2). Accordingly, the signal A from the input buffer 11 will have been delayed in the lower delay circuits 23-0 to 23-5 of the lower delay line 23 by the delay time Tck−(d1+d2) before being applied to the output buffer 13.

Accordingly, the total delay time from the input buffer 11 to the output buffer 13 is equal to d1+Tck −(d1+d2)+d2=Tck. In other words, the clock signal CLK which is input to the input buffer 11 is delayed by one complete cycle Tck of the clock signal CLK before being output from the output buffer 13 as the clock signal ICLK. Thus, the clock signal CLK which is input to the input buffer 11 and the clock signal ICLK which is output from the output buffer 13 are synchronized with each other.

In the timing compensation circuit 12 of the present example, the signal B rises in an earlier one of the upper delay circuits 22-0 to 22-7 of the upper delay line 22 as the clock signal CLK has a higher frequency (and hence a shorter cycle). Conversely, the signal B rises in a later one of the upper delay circuits 22-0 to 22-7 of the upper delay line 22 as the clock signal CLK has a lower frequency (and hence a longer cycle). Accordingly, the delay control circuit 24 determines that the clock signal CLK has a high frequency if a signal (b, c, d, e, or f) is received from one of the upper delay circuits 22-0 to 22-4 of the upper delay line 22, and determines that the clock signal CLK has a low frequency if a signal (i or a) is received from the upper delay circuit 22-7 of the upper delay line 22.

For example, if the delay control circuit 24 receives the signal b from the first upper delay circuit 22-0, the delay control circuit 24 determines that the clock signal CLK has a high frequency. Accordingly, the delay control circuit 24 shortens the first compensatory delay time of the former upper delay circuits 22-0 to 22-3 of the upper delay line 22 and the former lower delay circuits 23-0 to 23-3 of the lower delay line 23, which will force the signal B to rise in a later one of the upper delay circuits 22-0 to 22-7 of the upper delay line 22, until a signal from one of the latter upper delay circuits 22-4 to 22-7 is received by the delay control circuit 24. Specifically, the delay control circuit 24 keeps adjusting the first compensatory delay time of the former upper delay circuits 22-0 to 22-3 of the upper delay line 22 and the former lower delay circuits 23-0 to 23-3 of the lower delay line 23 until the delay control circuit 24 receives either the signal g or the signal h responsive to the rise of the signal B in either the latter upper delay circuit 22-5 or 22-6 of the upper delay line 22.

Conversely, if the delay control circuit 24 receives the signal a from the last upper delay circuit 22-7, the delay control circuit 24 determines that the clock signal CLK has a low frequency. Accordingly, the delay control circuit 24 prolongs the first compensatory delay time of the former upper delay circuits 22-0 to 22-3 of the upper delay line 22 and the former lower delay circuits 23-0 to 23-3 of the lower delay line 23, which will force the signal B to rise in an earlier one of the upper delay circuits 22-0 to 22-7 of the upper delay line 22. The delay control circuit 24 keeps adjusting the first compensatory delay time of the former upper delay circuits 22-0 to 22-3 of the upper delay line 22 and the former lower delay circuits 23-0 to 23-3 of the lower delay line 23 until the delay control circuit 24 receives either the signal g or the signal h responsive to the rise of the signal B in either the latter upper delay circuit 22-5 or 22-6 of the upper delay line 22.

Thus, the delay control circuit 24 adjusts the first compensatory delay time of the former upper delay circuits 22-0 to 22-3 of the upper delay line 22 and the former lower delay circuits 23-0 to 23-3 of the lower delay line 23 in accordance with the frequency of the clock signal CLK until it is ensured that the signal B rises in either the latter upper delay circuit 22-5 or 22-6.

Even if the rise of the signal B is shifted to occur in either the latter upper delay circuit 22-4 or 22-7, it is still ensured that the signal B rises in one of the latter upper delay circuits 22-4 to 22-7, which are prescribed with the sufficiently short second compensatory delay time. Responsive to the rise of the signal B in the latter upper delay circuit 22-4 or 22-7, one of the signals f, g, h, i is output from the latter upper delay circuits 22-4 to 22-7 to a corresponding one of the latter lower delay circuits 23-4 to 23-7 of the lower delay line 23. As a result, the signal A is output to the output buffer 13 from the corresponding one of the latter lower delay circuits 23-4 to 23-7 of the lower delay line 23.

Thus, the timing for outputting the signal A from the lower delay line 23 is adjusted with a high resolution which is equal to the sufficiently short second compensatory delay time.

For example, assuming that the former upper delay circuits 22-0 to 22-3 of the upper delay line 22 and the former lower delay circuits 23-0 to 23-3 of the lower delay line 23 have a first compensatory delay time Dn and that the latter upper delay circuits 22-4 to 22-7 of the upper delay line 22 and the latter lower delay circuits 23-4 to 23-7 of the lower delay line 23 have a second compensatory delay time Ds, the output timing for the signal A from the lower delay line 23 is adjustable within the range of 4Dn+Ds to 4Dn+4Ds, with a resolution which is equal to the second compensatory delay time Ds. Thus, the output timing for the signal A from the lower delay line 23 can be adjusted to attain highly accurate clock signal synchronization, based on the second compensatory delay time Ds which is prescribed to be sufficiently short for attaining highly accurate clock signal synchronization.

Now, the operation of the timing generation circuit according to the present example of the invention will be summarized with reference to a flowchart shown in FIG. 2.

When the clock signal CLK is input (step 201), the signal A is applied to the upper delay line 22 and the lower delay line 23, and the signal B is also applied to the upper delay line 22. In response, the signal a, for example, may be applied to the delay control circuit 24 from the last upper delay circuit 22-7 of the upper delay line 22 (step 202).

Upon receiving the signal a, the delay control circuit 24 prolongs the first compensatory delay time of the former upper delay circuits 22-0 to 22-3 of the upper delay line 22 and the former lower delay circuits 23-0 to 23-3 of the lower delay line 23 by a predetermined sufficiently long time (step 203). If this adjustment shifts the rise of the signal B so as to occur in the upper delay circuit 22-2 of the upper delay line 22, for example, then the signal d is applied from the upper delay circuit 22-2 to the delay control circuit 24 (step 204).

Upon receiving the signal d, the delay control circuit 24 shortens the first compensatory delay time of the former upper delay circuits 22-0 to 22-3 of the upper delay line 22 and the former lower delay circuits 23-0 to 23-3 of the lower delay line 23 by a predetermined short time (step 205). If this adjustment shifts the rise of the signal B so as to occur in the upper delay circuit 22-4 of the upper delay line 22, for example, then the signal f is applied from the upper delay circuit 22-4 to the delay control circuit 24 (step 206).

Upon receiving the signal f, the delay control circuit 24 again shortens the first compensatory delay time of the former upper delay circuits 22-0 to 22-3 of the upper delay line 22 and the former lower delay circuits 23-0 to 23-3 of the lower delay line 23 by a predetermined short time (step 207). If this adjustment shifts the rise of the signal B so as to occur in the upper delay circuit 22-5 of the upper delay line 22, for example, then the signal g is applied from the upper delay circuit 22-5 to the delay control circuit 24 (step 208).

Upon receiving the signal g, the delay control circuit 24 no longer adjusts the delay time. At this stage, the signal A from the input buffer 11 has been delayed in the lower delay circuits 23-0 to 23-5 of the lower delay line 23 by a total delay time which is equal to Tck−(d1+d2), and now is ready for transfer into the output buffer 13. Thus, the clock signal CLK which is input to the input buffer 11 and the clock signal ICLK which is output from the output buffer 13 are synchronized with each other (step 209).

Figure 3A:
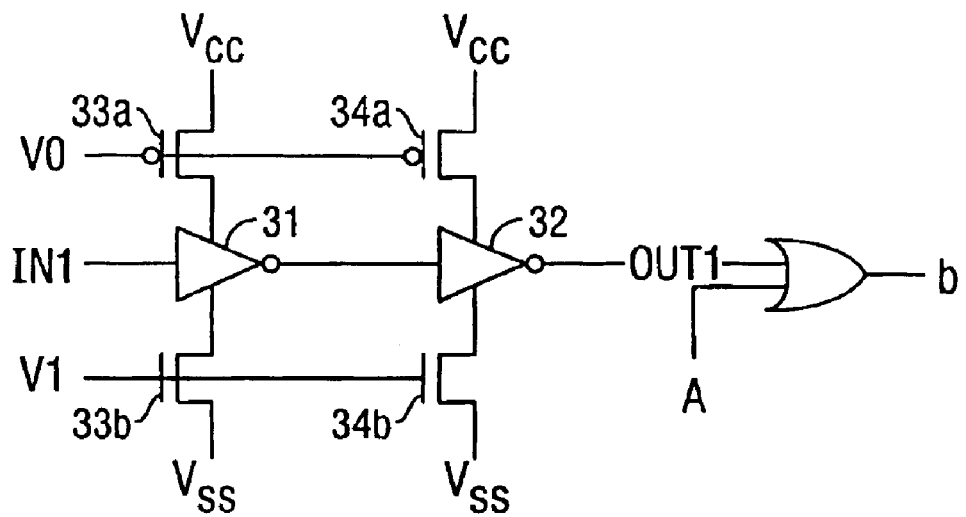
FIG. 3A, illustrates examples of the former upper delay circuit in the FIG. 1 timing generation circuit.
Figure 3B:
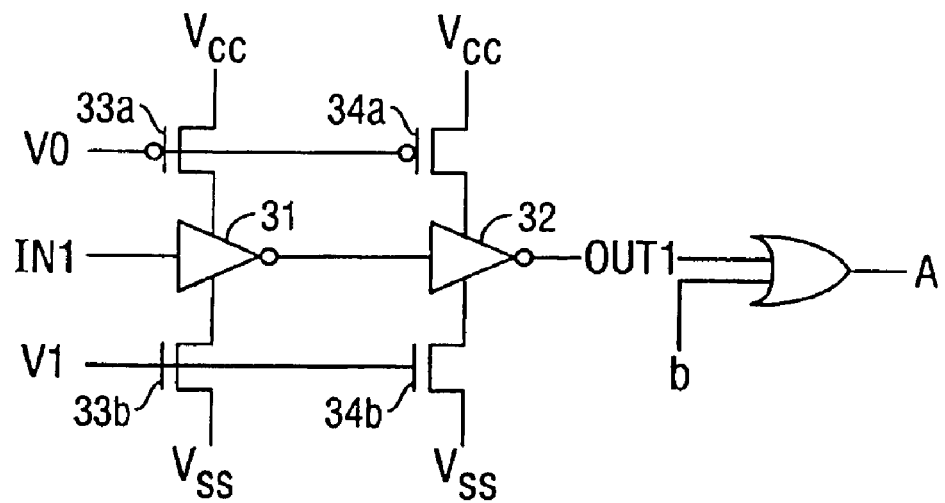
FIG. 3B, illustrates an example of the former lower delay circuit in the FIG. 1 timing generation circuit.

FIG. 3A is a circuit diagram illustrating each of the former upper delay circuits 22-0 to 22-3 of the upper delay line 22, and FIG. 3B is a circuit diagram illustrating each of the former lower delay circuits 23-0 to 23-3 of the lower delay line 23. The delay circuit shown in FIG. 3 includes two inverters 31 and 32 for delaying the signal A or B while the signal is transmitted therethrough, a pair of transistors 33$a$ and 33$b$ for adjusting the delay time of the inverter 31, and a pair of transistors 343$a$ and 34$b$ for adjusting the delay time of the inverter 32. A supply voltage Vcc is applied to the transistors 33$a$ and 34$a$, and a reference voltage Vss is applied to the transistors 33$b$ and 34$b$.

When the gate voltage V0 of the transistors 33$a$ and 34$a$ is increased and the gate voltage V1 of the transistors 33$b$ and 34$b$ is decreased, the currents which flow in the inverters 31 and 32 decrease, so that the delay time of the inverters 31 and 32 is prolonged. Conversely, when the gate voltage of the transistors 33$a$ and 34$a$ is decreased and the gate voltage V1 of the transistors 33$b$ and 34$b$ is increased, the currents which flow in the inverters 31 and 32 increase, so that the delay time of the inverters 31 and 32 is shortened.

Figure 4A:
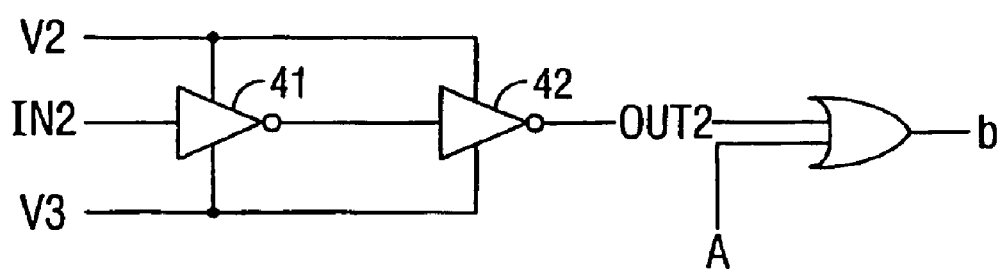
FIG. 4A, illustrates examples of the former upper delay circuit in the FIG. 1 timing generation circuit.
Figure 4B:
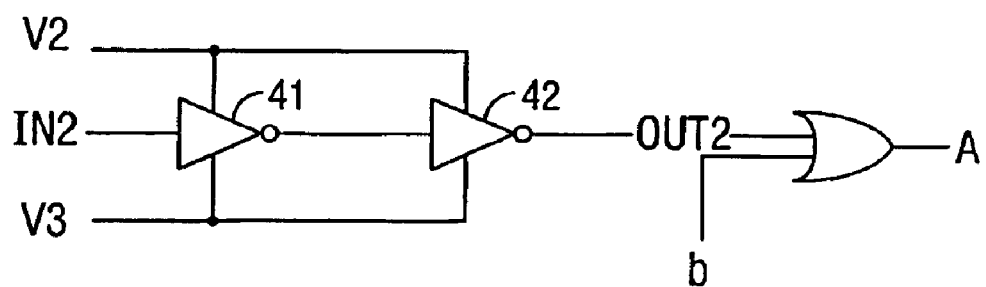
FIG. 4B, illustrates an example of the former lower delay circuit in the FIG. 1 timing generation circuit.

FIG. 4A is a circuit diagram illustrating another example of each of the former upper delay circuits 22-0 to 22-3 of the upper delay line 22, and FIG. 4B is a circuit diagram illustrating each of the former lower delay circuits 23-0 to 23-3 for the lower delay line 23. The delay circuit shown in FIG. 4 includes two inverters 41 and 42 for delaying the signal A or B while the signal is transmitted therethough. When the difference between voltages V2 and V3 is decreased, the delay time of the inverters 41 and 42 is prolonged. Conversely, when the difference between voltages V2 and V3 is increased, the delay time of the inverters 41 and 42 is shortened.

Figure 5A:
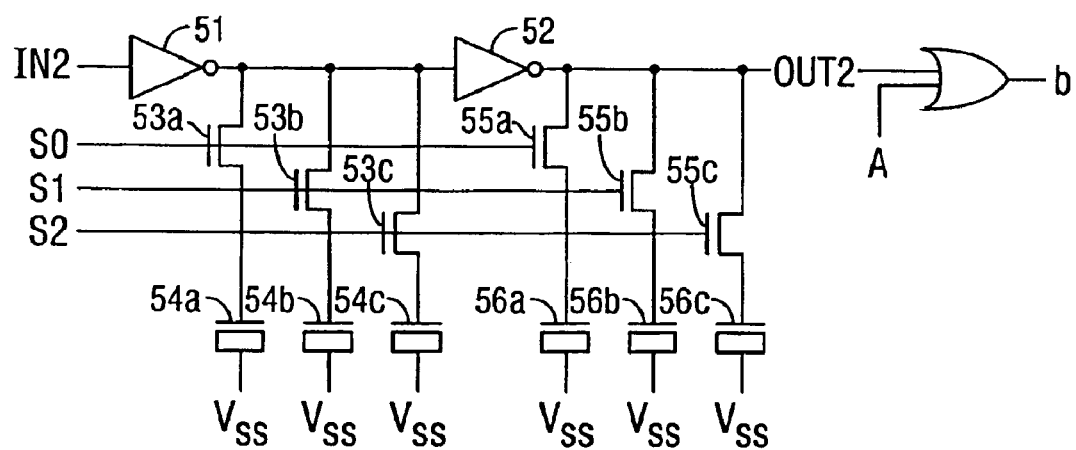
FIG. 5A, illustrates examples of the former upper delay circuit in the FIG. 1 timing generation circuit.
Figure 5B:
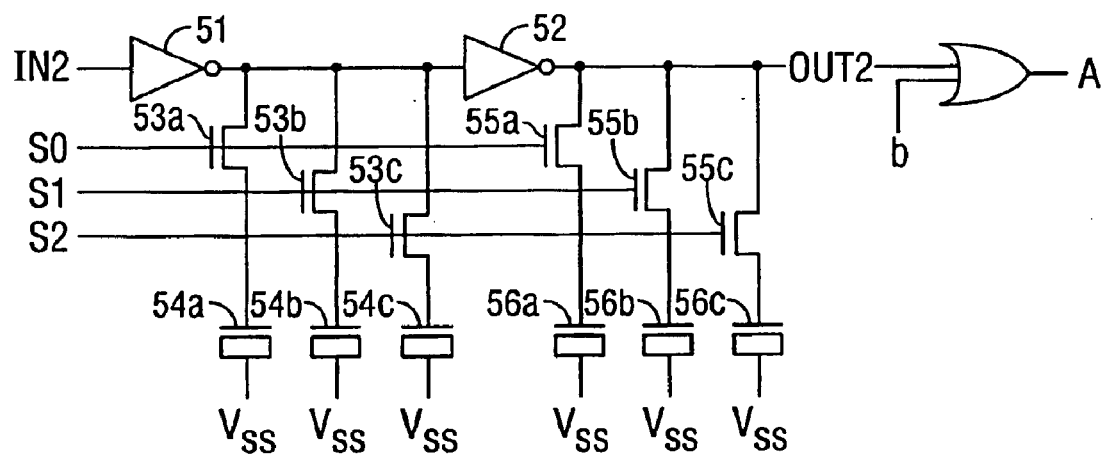
FIG. 5B, illustrates an example of the former lower delay circuit in the FIG. 1 timing generation circuit.

FIG. 5A is a circuit diagram illustrating yet another example of each of the former upper delay circuits 22-0 to 22-3 of the upper delay line 22, and FIG. 5B is a circuit diagram illustrating each of the of the former lower delay circuits 23-0 to 23-3 of the lower delay line 23. The delay circuit shown in FIG. 5 includes: two inverters 51 and 52 for delaying the signal A or B while the signal is transmitted therethrough; transistors 53$a$, 53$b$, 53$c$ and passive elements (capacitors) 54$a$, 54$b$, 54$c$ which are coupled to an output node of the inverter 51; and transistors 55$a$, 55$b$, 55$c$ and passive elements (capacitors 56$a$, 56$b$, 56$c$ coupled to an output node of the inverter 52.

The capacitance of the output side of the inverter 51 and the output side of the inverter 52 can be simultaneously adjusted by selectively causing the signals S0, S1 and/or S2 to go high. Specifically, when the signals S0, S1 and or S2 go high, the transistors 53$a$, 53$b$, and/or 53$c$ which are connected to the output node of the inverter 51 are selectively turned on, so that the capacitors 54$a$, 54$b$ and/or 54$c$ are selectively coupled to the output node of the inverter 51. At the same time, the transistors 55$a$, 55$b$, and/or 55$c$ which are connected to the output node of the inverter 52 are selectively turned on, so that the capacitors 56$a$, 56$b$ and/or 56$c$ are selectively coupled to the output node of the inverter 52. By increasing the capacitance of the output side of the inverter 51 and the output side of the inverter 52, the delay time of the inverters 51 and 52 can be prolonged. By decreasing the capacitance of the output side of the inverter 51 and the output side of the inverter 52, the delay time of the inverters 51 and 52 can be shortened.

In any one of the delay circuits shown in FIGS. 3, 3A, 3B, 4A, 4B, 5A and 5B the output of the latter inverter (i.e., the inverter 32,42, or 52) is transferred to a subsequent delay circuit. Each one of the upper delay circuits 22-0 to 22-7 of the upper delay line 22 calculates a logical OR between the output of the latter inverter (ie., the inverter 32, 42, or 52) and the signal A, and outputs the calculated logical OR value to the lower delay circuits 23-0 to 23-7 of the lower delay line 23 as the signal b, c, d, e, f, g, h, or i. Each of the lower delay circuits 23-0 to 23-7 of the lower delay line 23 calculates a logical OR between the output of the latter inverter (i.e., the inverter 32, 42, or 52) and the signal b, c, d, e, f, g, h, or I, and outputs the calculated logical OR value to the output buffer 13 as the signal A.

EXAMPLE 2

Figure 6:
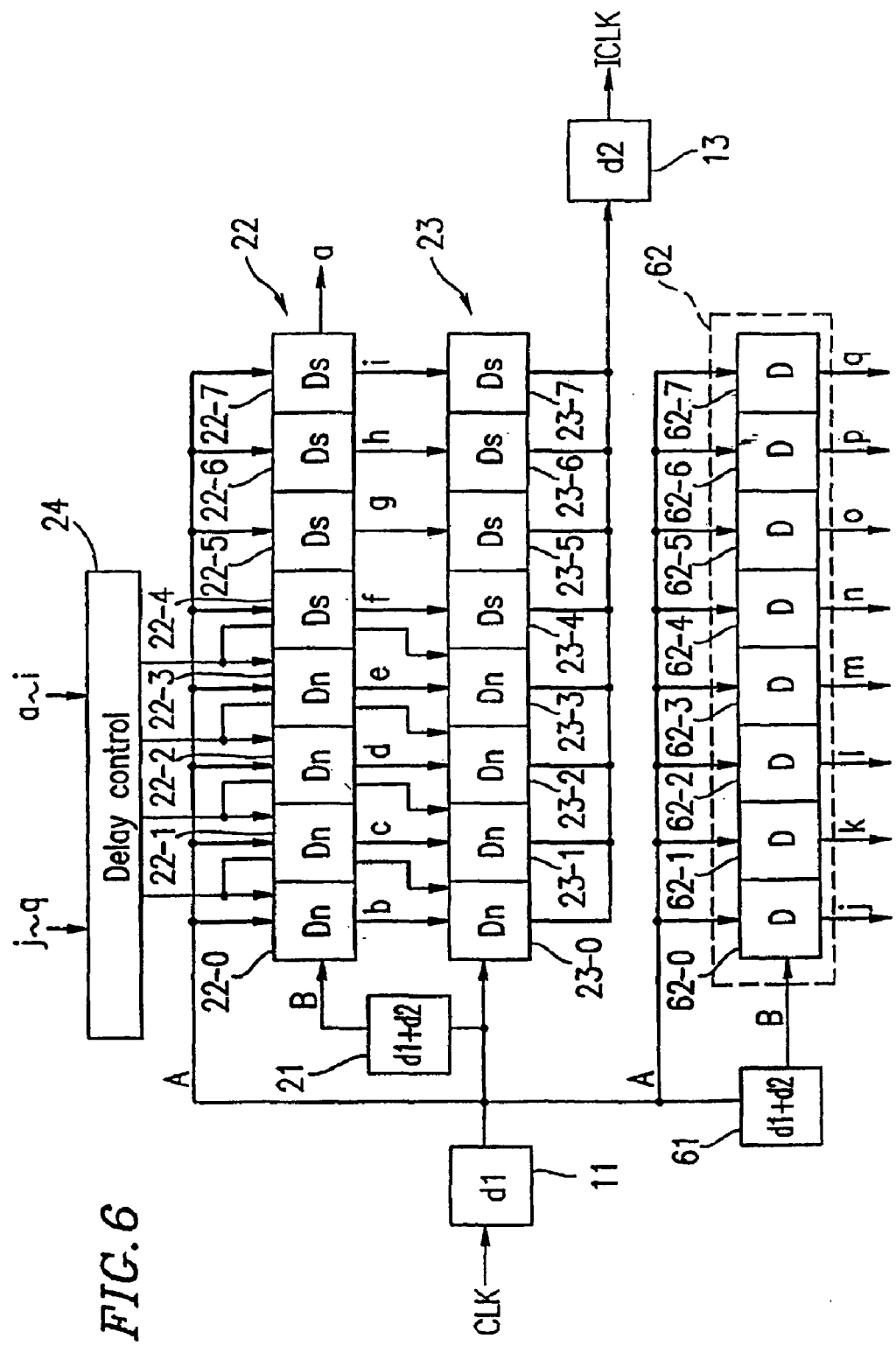
FIG. 6 is a block diagram illustrating a timing generation circuit according to Example 2 of the present invention.

FIG. 6 is a block diagram illustrating a timing generation circuit according to Example 2 of the present invention. The timing generation circuit shown in FIG. 6 has the same basic structure as that of the timing generation circuit according to Example 1 except that the timing generation circuit shown in FIG. 6 additionally incorporates a detection section implemented as a frequency detection delay circuit 61, and a frequency detection delay line 62, which includes delay circuits 62-0 to 62-7. Signals j, k, l, m, n, o, p, and q from the delay circuits 62-0 to 62-7 are applied to the delay control circuit 24. In FIG. 6, elements which also appear in FIG. 1 are denoted by the same reference numerals as used therein.

The frequency detection delay circuit 61 and the frequency detection delay line 62 essentially have the same structure as the delay circuit 21 and the upper delay line 22, respectively. However, the delay time of the delay circuits 62-0 to 62-7 of the frequency detection delay line 62 is prescribed to be substantially longer than the first compensatory delay time of the former upper delay circuits 22-0 to 22-3 of the upper delay line 22.

The frequency detection delay circuit 61 receives a signal A, which has been delayed in the input buffer 11 by the delay time d1 relative to the clock signal CLK, and further delays the signal A by a delay time which is equal to d1+d2 so as to generate a signal B. The signal B is applied to the frequency detection delay line 62.

After the rising edge of the signal B is received by the frequency detection delay circuit 61, the signal B rises, responsive to a next rising edge of the signal A, in one of the delay circuits 62-0 to 62-7 of the frequency detection delay line 62.

The signal B rises in an earlier one of the delay circuits 62-0 to 62-7 of the frequency detection delay line 62 as the clock signal CLK has a higher frequency (and hence a shorter cycle). Conversely, the signal B rises in a later one of the delay circuits 62-0 to 62-7 of the frequency detection delay line 62 as the clock signal CLK has a lower frequency (and hence a longer cycle) Accordingly, the delay control circuit 24 determines that the clock signal CLK has a high frequency if a signal (e.g., j, k, l, or m) is received from one of the former delay circuits 62-0 to 62-3 (hereinafter collectively referred to as the "former delay circuits") of the frequency detection delay line 62, and determines that the clock signal CLK has a low frequency if a signal (n, o, p, or q) is received from one of the latter delay circuits 62-4 to 62-7 (hereinafter collectively referred to as the "latter delay circuits") of the frequency detection delay line 62.

Thus, according to the present example, the frequency of the clock signal CLK is detected based on the signals j to q from the respective delay circuits 62-0 to 62-7 of the frequency detection delay line 62. As described earlier, the delay time of the delay circuits 62-0 to 62-7 of the frequency detection delay line 62 is prescribed to be sufficiently longer than the first compensatory delay time of the former upper delay circuits 22-0 to 22-3 of the upper delay line 22. Therefore, even in the case where the clock signal CLK has a low frequency (and hence a long cycle), the signal A comes to a next rising edge before overflowing the frequency detection delay line 62, causing the signal B to rise in one of the delay circuits 62-0 to 62-7 of the frequency detection delay line 62. As a result, one of the signals J to q is successfully output for use in the detection of the frequency of the clock signal CLK.

On the other hand, the delay time of the upper delay circuits 22-0 to 22-7 of the upper delay line 22 is prescribed at a relatively short value in order to prevent deterioration in the clock signal synchronization accuracy. According to Example 1, therefore, the upper delay line 22 may be overflowed if the clock signal CLK has a long cycle, causing the signal a from the last upper delay circuit 22-7 to be applied to the delay control circuit 24. In this case, the delay control circuit 24 may be able to determine that the clock signal CLK has a long cycle based on the received signal a, but cannot determine how long the cycle is.

According to the present example, a set of respective delay times are prescribed so as to generally correspond to the signals j to g (which generally correspond to various values in a predetermined range of frequencies) with a relatively low resolution. Depending on which one of the signals j to q is received from the delay circuits 62-0 to 62-7 of the frequency detection delay line 62, the delay control circuit 24 selects a corresponding one of the aforementioned set of delay times and adjusts the first compensatory delay time of the former upper delay circuits 22-0 to 22-3 of the upper delay line 22 and the former lower delay circuits 23-0 to 23-3 of the lower delay line 23 to the selected value.

Thereafter, the delay control circuit 24 detects the frequency of the clock signal CLK with a higher accuracy or resolution based on the signals a to i from the upper delay circuits 22-0 to 22-7 of the upper delay line 22. In accordance with the detected frequency of the clock signal CLK, the delay control circuit 24 sets the delay time of the former upper delay circuits 22-0 to 22-3 of the upper delay line 22 and the former lower delay circuits 23-0 to 23-3 of the lower delay line 23 with a higher resolution.

Figure 7:
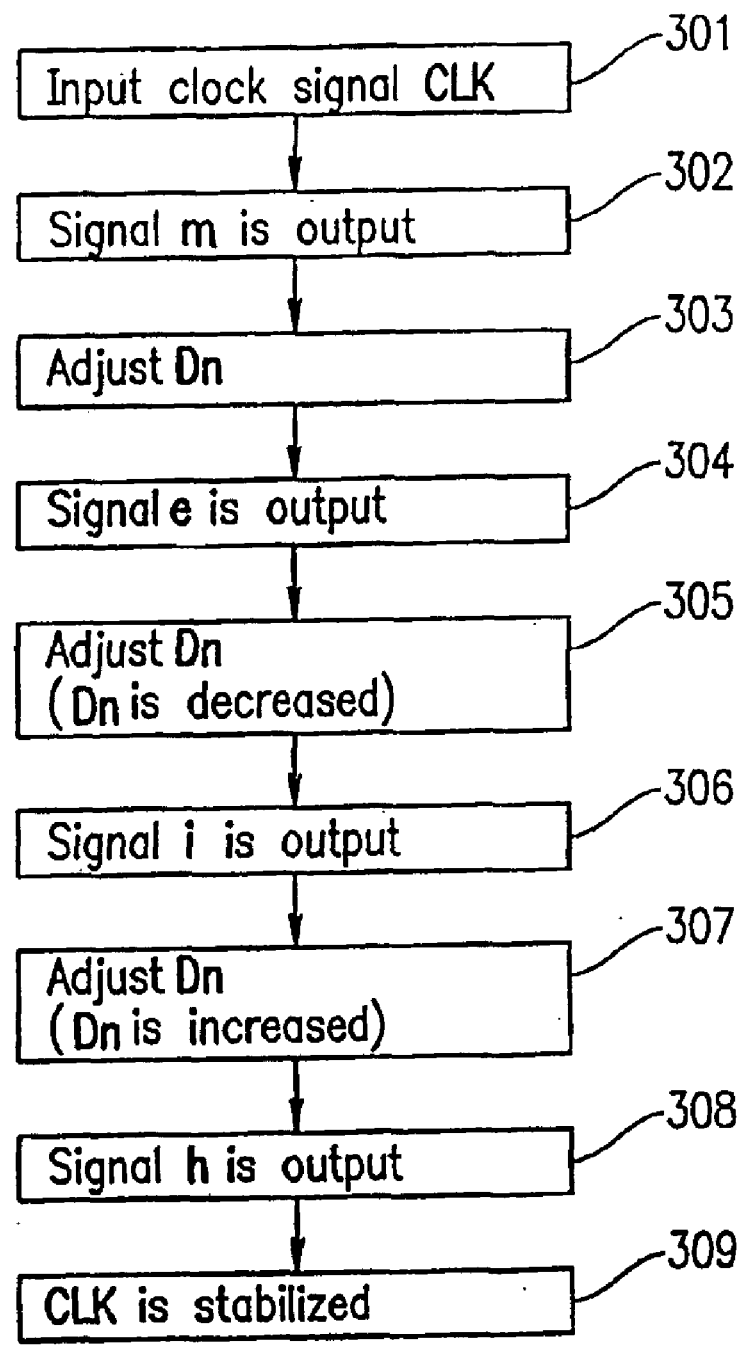
FIG. 7 is a flowchart describing the operation of the timing generation circuit of FIG. 6.

Now, the operation of the timing generation circuit according to the present example of the invention will be summarized with reference to a flowchart shown in FIG. 7.

When the clock signal CLK is input (step 301), the signal A is applied to the upper delay line 22 and the lower delay line 23, and the signal B is also applied to the upper delay line 22; at the same time, the signal B is applied to the frequency detection delay line 62. In response, the signal m, for example, may be applied to the delay control circuit 24 from the delay circuit 62-3 of the frequency detection delay line 62 (step 302).

Upon receiving the signal m, the delay control circuit 24 selects the one of the aforementioned low-resolution set of prescribed delay times that corresponds to the signal m, and adjusts the first compensatory delay time of the former upper delay circuits 22-0 to 22-3 of the upper delay line 22 and the former lower delay circuits 23-0 to 23-3 of the lower delay line 23 to the selected value (step 303). If this adjustment shifts the rise of the signal B so as to occur in the upper delay circuit 22-3 of the upper delay line 22, for example, then the signal e is applied from the upper delay circuit 22-3 to the delay control circuit 24 (step 304).

Upon receiving the signal e, the delay control circuit 24 shortens the first compensatory delay time of the former upper delay circuits 22-0 to 22-3 of the upper delay line 22 and the former lower delay circuits 23-0 to 23-3 of the lower delay line 23 by a predetermined short time (step 305). If this adjustment shifts the rise of the signal B so as to occur in the upper delay circuit 22-7 of the upper delay line 22, for example, then the signal i is applied from the upper delay circuit 22-7 to the delay control circuit 24 (step 306).

Upon receiving the signal i, the delay control circuit 24 prolongs the first compensatory delay time of the former upper delay circuits 22-0 to 22-3 of the upper delay line 22 and the former lower delay circuits 23-0 to 23-3 of the lower delay line 23 by a predetermined short time (step 307). If this adjustment shifts the rise of the signal B so as to occur in the upper delay circuit 22-6 of the upper delay line 22, for example, then the signal h is applied from the upper delay circuit 22-6 to the delay control circuit 24 (step 308).

Upon receiving the signal h, the delay control circuit 24 no longer adjusts the delay time. At this stage, the signal A from the input buffer 11 has been delayed in the lower delay circuits 23-0 to 23-5 of the lower delay line 23 by a total delay time which is equal to Tck−(d1+d2), and now is ready for transfer into the output buffer 13. Thus, the clock signal CLK which is input to the input buffer 11 and the clock signal ICLK which is output from the output buffer 13 are synchronized with each other (step 309).

It will be appreciated that the number of former delay circuits and the number of latter delay circuits in the upper and lower delay lines may be arbitrarily defined. For example, if fewer delay circuits in the upper and lower delay lines are defined as "former delay circuits", then correspondingly more delay circuits are defined as "latter delay circuits". Conversely, if more delay circuits in the upper and lower delay lines are defined as "former delay circuits", then correspondingly fewer delay circuits are defined as "latter delay circuits".

EXAMPLE 3

Figure 10:
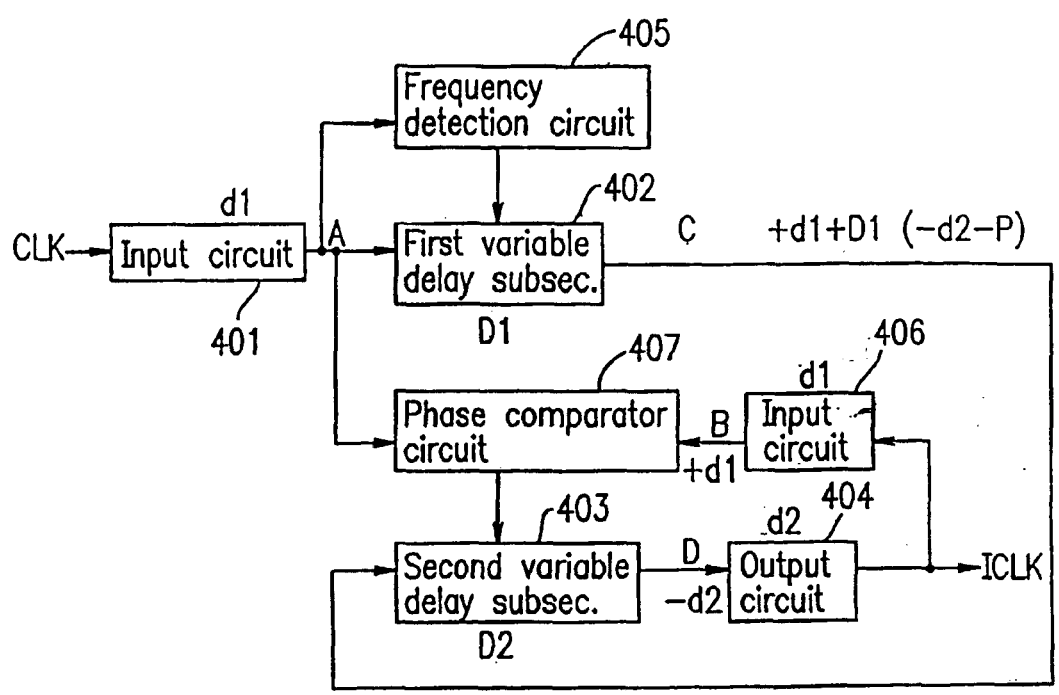
FIG. 10 is a block diagram illustrating a timing generation circuit according to Example 3 of the present invention.

FIG. 10 is a block diagram illustrating a timing generation circuit according to Example 3 of the present invention. With reference to FIG. 10, an input circuit 401 receives a clock signal CLK and generates a signal A by delaying the clock signal CLK by a delay time d1. A first variable delay subsection 402 receives the signal A and generates a signal C by further delaying the signal A by a delay time D1. A second variable delay subsection 403 receives the signal C and generates a signal D by further delaying the signal C by a delay time D2. An output circuit 404 receives the signal D and generates a clock signal ICLK by further delaying the signal D by a delay time d2. The clock signal ICLK is output, which is synchronized with the input clock signal CLK.

A frequency detection circuit 405, which receives the signal A and detects the frequency of the signal A (i.e., the clock signal frequency), increases the delay time D1 of the first variable delay subsection 402 as the detected clock frequency decreases. After adjusting the delay time of the first variable delay subsection 402 in this manner, the frequency detection circuit 405 locks the first variable delay subsection 402 because, if the delay time of the first variable delay subsection 402 changed during the adjustment of the second variable delay subsection 403, it would be impossible to adjust the delay time D2 of the second variable delay subsection 403.

A dummy input circuit 406 receives the clock signal ICLK and outputs a signal B which is further delayed by the delay time d1. A phase comparator circuit 407 receives the signals A and B, and adjusts the delay time D2 in the second variable delay subsection 403 so that the signals A and B are synchronized with each other. As a result, the signal D which is output from the second variable delay subsection 403 is delayed by a delay time −d2 (i.e., advanced by the time duration d2) with respect to the clock signal CLK, and thereafter is further delayed by the delay time d2 in the output circuit 404. Thus, the clock signal ICLK which is output from the output circuit 404 is synchronized with the input clock signal CLK.

Figure 11:
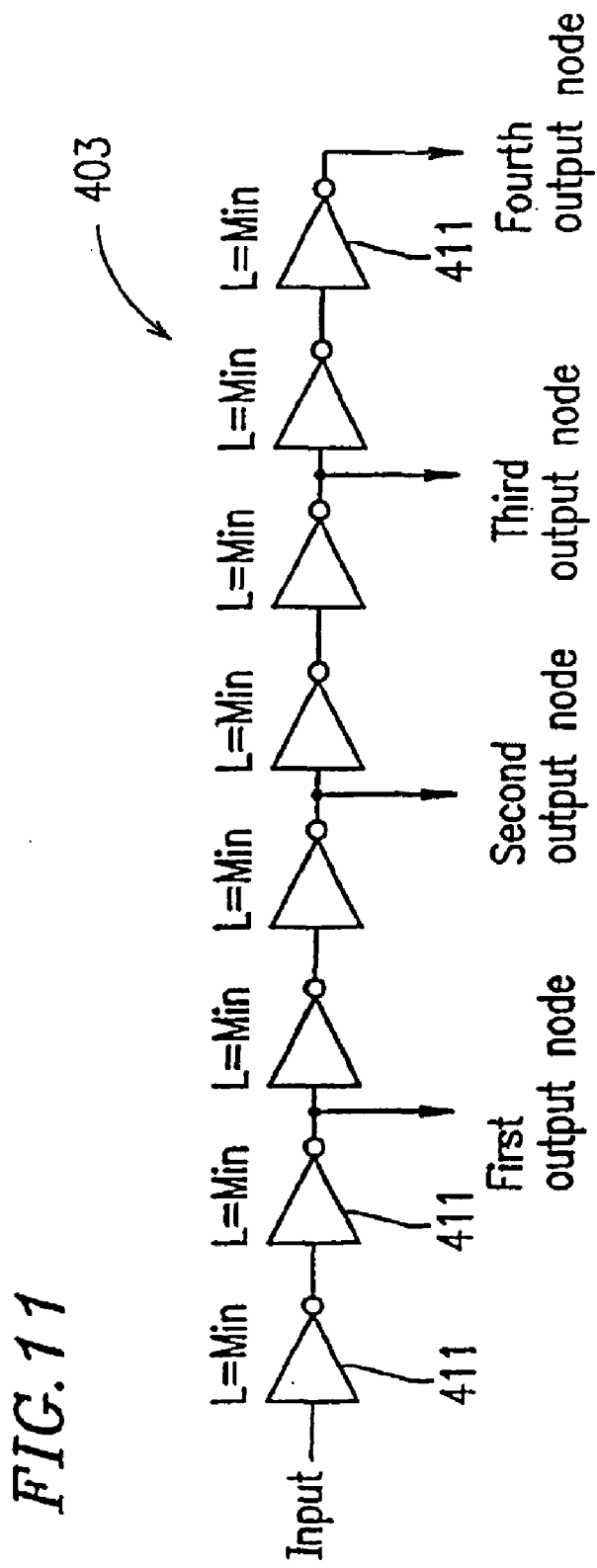
FIG. 11 is a circuit diagram illustrating an exemplary structure of a second variable delay subsection in the timing generation circuit of FIG. 10.

FIG. 11 illustrates an exemplary structure of the second variable delay subsection 403. The illustrated second variable delay subsection 403 includes a serial connection of eight inverters (i.e., delay circuits) 411, each including a transistor (not shown). An output node is provided after every other two inverters 411 (i.e., the first, second, third, and fourth output nodes). Among the four output nodes illustrated in FIG. 11, the signal on the first output node receives the shortest delay time, and the signal on a later output node always receives a longer delay time than the signal on an earlier output node. The phase comparator circuit 407 selects an appropriate one of the signals on the output nodes of the second variable delay subsection 403 to ensure that the signals A and B are synchronized with each other, and outputs the selected signal as the signal D.

In the second variable delay subsection 403, the W/L (i.e., gate width/gate length) of the transistors, capacitance, resistance and the like included in the respective inverters 411 are adjusted so as to ensure that the respective delay times are increased by minute increments. In particular, the L and the capacitance of each transistor are minimized.

Figure 12:
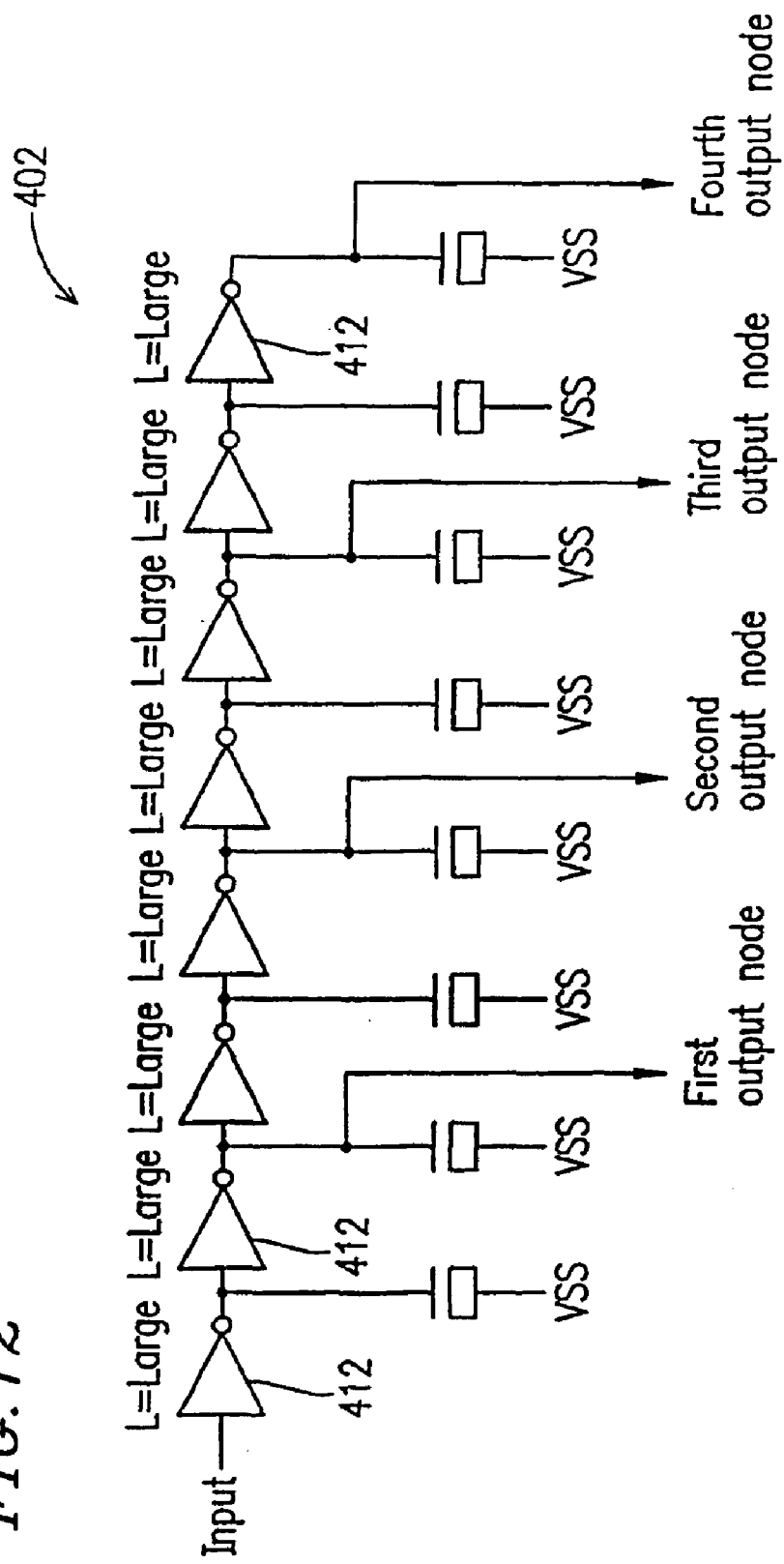
FIG. 12 is a circuit diagram illustrating an exemplary structure of a first variable delay subsection in the timing generation circuit of FIG. 10.

FIG. 12 illustrates an exemplary structure of the first variable delay subsection 402. The illustrated first variable delay subsection 402 includes a serial connection of eight inverters (i.e., delay circuits) 412, each including a transistor (not shown). An output node is provided after every two inverters 412 (i.e., the first, second, third, and fourth output nodes). Among the eight output nodes illustrated in FIG. 12, the signal on the first output node receives the shortest delay time, and the signal on a later output node always receives a longer delay time than the signal on an earlier output node. The frequency detection circuit 405 selects a later one of the signals on the output nodes of the first variable delay subsection 402 as the detected frequency of the signal A decreases, and outputs the selected signal as the signal C.

In the first variable delay subsection 402, the W/L of the transistors, capacitance, resistance and the like included in the respective inverters 412 are adjusted so as to ensure that the respective delay times are increased by relatively large increments. In particular, relatively large values are prescribed for the L and the capacitance of each transistor. Alternatively, it is also applicable to employ inverters having variable capacitance, etc., and adjust the delay time of each inverter by controlling the capacitance of the inverter.

The series of delay circuits illustrated in FIGS. 11 and 12 are given as mere examples. The structure of the respective delay circuits and/or the number of delay circuits to be incorporated may be selected in accordance with the requirements of each particular application.

Now, the operation principle of the timing generation circuit of the present example is described. The input clock signal CLK is delayed in the first variable delay subsection 402 by the delay time D1, which is determined in accordance with the frequency of the clock signal CLK. The delay time D1 can only be coarsely adjusted, with an adjustment resolution which corresponds to the delay time that can be provided by each single delay circuit within the first variable delay subsection 402. On the other hand, the clock signal ICLK is delayed by the delay time d2 with respect to the signal D which is output from the second variable delay subsection 403; this makes it imperative that the signal D from the second variable delay subsection 403 receive a delay time which is equal to −d2. Thus, in order for the second variable delay subsection 403 to be able to delay the signal C from the first variable delay subsection 402 for final adjustment, the signal C must arrive at the second variable delay subsection 403 before the signal D, having a delay time which is equal to −d2, is issued from the second variable delay subsection 403. Accordingly, the frequency detection circuit 405 controls the delay time D1 in the first variable delay subsection 402 so that the signal C from the first variable delay subsection 402 receives a delay time (d1+D1) which is equal to (−d2−P), where P represents a time duration within the delaying capability of the second variable delay subsection 403.

Thus, the signal C from the first variable delay subsection 402 is adjusted by the second variable delay subsection 403 and the phase comparator circuit 407. Specifically, the phase comparator circuit 407 keeps adjusting the delay time D2 in the second variable delay subsection 403 until the rises of the signals A and B coincide with each other (or, in practice, until the rising edges of the signals A and B are converged so as to occur within an allowable time range from each other).

Since the delay time in each delay circuit within the second variable delay subsection 403 is prescribed at a relatively small value (i.e., so as to attain a high resolution), the timing generation circuit according to the present example can achieve a highly accurate adjustment. Yet, since a relatively long delay time is provided by the entire first variable delay subsection 402, it is unnecessary to employ a large number of delay circuits in the second variable delay subsection 403. As a result, the second variable delay subsection 403 occupies a minimum area.

On the other hand, the delay time in each delay circuit within the first variable delay subsection 402 is prescribed at a relatively large value. Therefore, the entire first variable delay subsection 402 can provide a long delay time without employing a large number of delay circuits. As a result, the area which is occupied by the first variable delay subsection 402 is prevented from becoming excessive.

EXAMPLE 4

Figure 13:
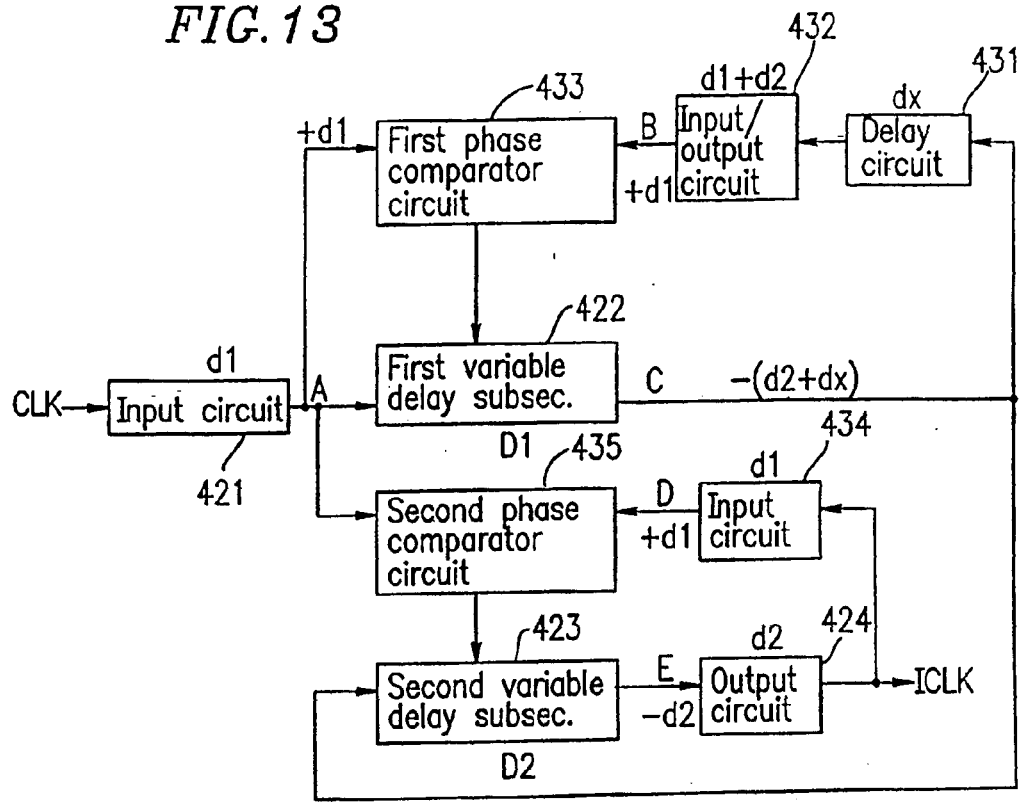
FIG. 13 is a block diagram illustrating a timing generation circuit according to Example 4 of the present invention.

FIG. 13 is a block diagram illustrating a timing generation circuit according to Example 4 of the present invention. With reference to FIG. 13, an input circuit 421 receives a clock signal CLK and generates a signal A by delaying the clock signal CLK by a delay time d1. A first variable delay subsection 422 receives the signal A and generates a signal C by further delaying the signal A by a delay time D1. A second variable delay subsection 423 receives the signal C and generates a signal E by further delaying the signal C by a delay time D2. An output circuit 424 receives the signal E and generates a clock signal ICLK by further delaying the signal E by a delay time d2. The clock signal ICLK is output, which is synchronized with the input clock signal CLK.

A delay circuit 431, which receives the signal C, delays the signal C by a delay time dx and outputs the delayed signal to a dummy input/output circuit 432. The dummy input/output circuit 432 generates a signal B by further delaying the signal from the delay circuit 431 by a delay time (d1+d2) and outputs the signal B. A first phase comparator circuit 433 receives the signals A and B, and adjusts the delay time D1 in the first variable delay subsection 422 so that the signals A and B are synchronized with each other. As a result, the signal C which is output from the first variable delay subsection 422 is delayed by a delay time −(d2+dx) (i.e., advanced by the time duration d2+dx) with respect to a next rising edge of the clock signal CLK.

A dummy input circuit 434, which receives the clock signal ICLK, generates a signal D by delaying the clock signal ICLK by a delay time d1, and outputs the signal D. A second phase comparator circuit 435 receives the signals A and D, and adjusts the delay time D2 in the second variable delay subsection 423 so that the signals A and D are synchronized with each other. As a result, the signal E which is output from the second variable delay subsection 423 is delayed by a delay time −d2 (i.e., advanced by the time duration d2) with respect to the clock signal CLK, and thereafter is further delayed by the delay time d2 in the output circuit 424. Thus, the clock signal ICLK which is output from the output circuit 424 is synchronized with the input clock signal CLK.

The delay time D1 in the first variable delay subsection 422 is adjusted until the rises of the signals A and B coincide with each other (or, in practice, until the rising edges of the signals A and B are converged so as to occur within an allowable time range from each other). Thereafter, the delay time D1 is locked so as to prevent any fluctuation of the delay time D1. The delay time D1 can only be coarsely adjusted, with an adjustment resolution which corresponds to the delay time of each delay circuit within the first variable delay subsection 422.

In order for the second variable delay subsection 423 to be able to delay the signal C from the first variable delay subsection 422 for final adjustment, the signal C must arrive at the second variable delay subsection 423 before the signal E, having a delay time which is equal to −d2, is issued from the second variable delay subsection 423. Accordingly, the delay circuit 431 having the delay time of dx is inserted so that the signal C output from the first variable delay subsection 422 receives a delay time of −(d2+dx).

For the sake of explanation, it is assumed that the adjustment of the delay time in the first variable delay subsection 422 is subject to error so that the delay time in the first variable delay subsection 422 is in the range of (an intended delay time)±K, where K corresponds to the delay time of each delay circuit within the first variable delay subsection 422. Since the delay time of the first variable delay subsection 422 is controlled based on the number of delay circuits deployed, the delay time of each signal delay circuit bottlenecks the adjustment accuracy of the first variable delay subsection 422. Accordingly, the signal C output from the first variable delay subsection 422 may have a delay time which is equal to −(d2+dx)±K.

Hence, it is necessary to cancel the component dx±K in the delay time −(d2+dx)±K of the signal C by means of the second variable delay subsection 423. If the component dx±K exceeds the maximum delay time in the second variable delay subsection 423, it becomes impossible to delay the signal E up to the delay time −d2. On the other hand, if the component dx±K takes a negative value, the signals C and E may be more advanced than is possible with the delay time −d2, thereby making it impossible to optimize the delay time for the signal E based on the delay time in the second variable delay subsection 423. Therefore, the delay time dx, the delay time of each delay circuit in the first variable delay subsection 422, and the maximum delay time in the second variable delay subsection 423 are prescribed so as to satisfy the aforementioned criteria.

The delay time of each delay circuit within the second variable delay subsection 423 is correlated with the minimum resolution of the timing generation circuit according to the present example. The maximum delay time in the first variable delay subsection 422 is correlated with the lowest frequency of the clock signal that can be properly processed by the timing generation circuit according to the present example. The lowest frequency of the input clock signal may be further lowered by arranging the timing generation circuit so that the delay time of each delay circuit within the first variable delay subsection 422 can be changed in accordance with the clock signal frequency, whereby the frequency range of the clock signal that may be input to the timing generate circuit according to the present example can be broadened. However, such an arrangement may lead to a greater error K in the delay time of the first variable delay subsection 422. In this case, it is necessary to pay attention to the possibly greater error K in the delay time of the first variable delay subsection 422, and ensure that the delay time dx±K does not exceed the maximum delay time in the second variable delay subsection 423 and that the delay time dx±K does not take a negative value.

EXAMPLE 5

Figure 14:
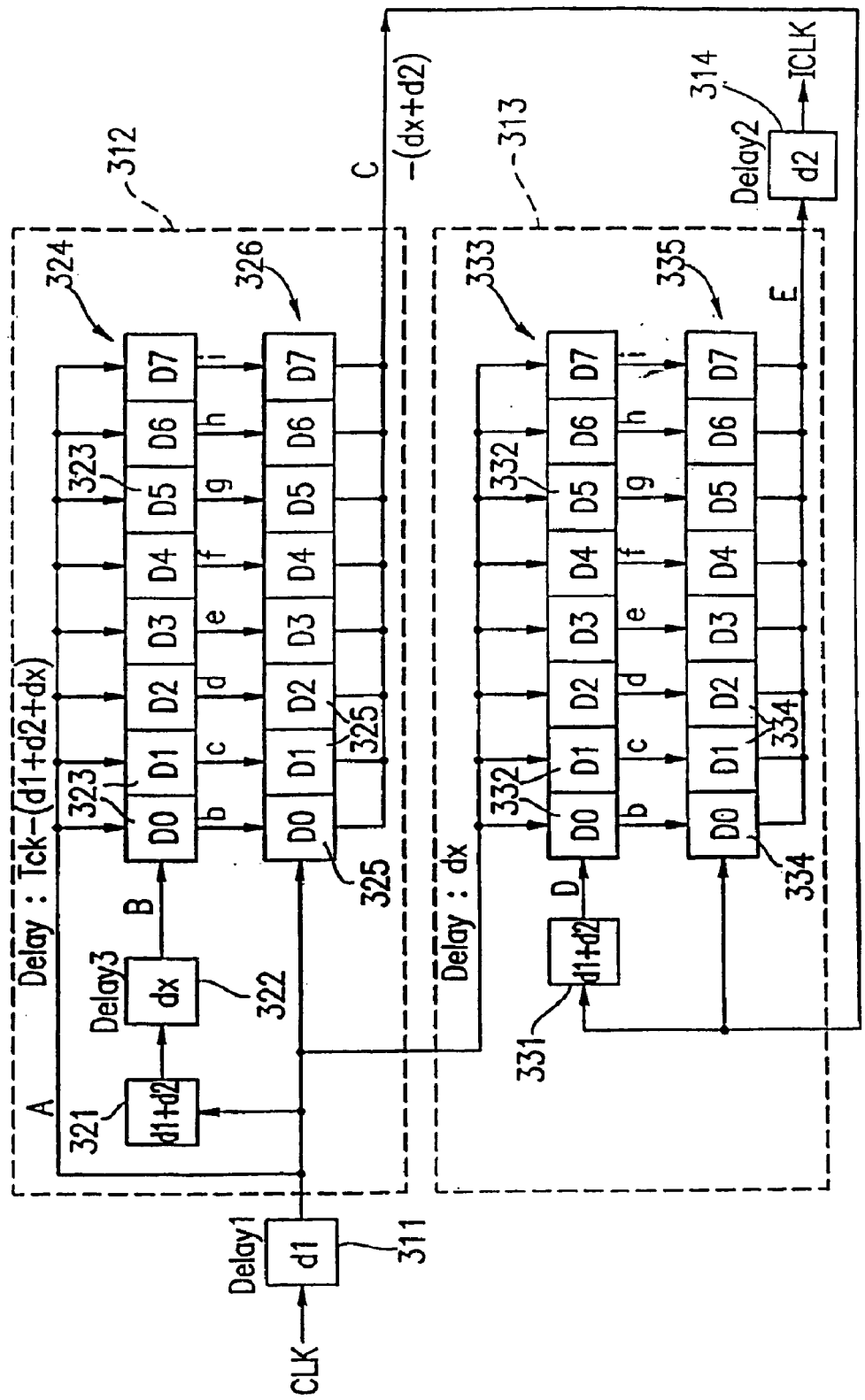
FIG. 14 is a block diagram illustrating a timing generation circuit according to Example 5 of the present invention.

FIG. 14 is a block diagram illustrating a timing generation circuit according to Example 5 of the present invention. With reference to FIG. 14, an input buffer 311 receives a clock signal CLK and generates a signal A by delaying the clock signal CLK by a delay time d1, and the signal A is output to a first timing compensation section 312. The first timing compensation section 312 generates a signal C by further delaying the signal A by a delay time Tck−(d1+d2+dx) and applies the signal C to a second timing compensation section 313. The second timing compensation section 313 generates a signal E by further delaying the signal C by a delay time dx and applies the signal E to an output buffer 314. The output buffer 314 generates a clock signal ICLK by further delaying the signal E by a delay time d2. The clock signal ICLK is output, which has been delayed by one complete cycle from, and therefore is synchronized with, the input clock signal CLK.

The first timing compensation section 312 includes a first delay circuit 321, a second delay circuit 322, an upper delay line 324 including a plurality of upper delay circuits 323 having a relatively long delay time, and a lower delay line 326 including a plurality of lower delay circuits 325 having the same relatively long delay time as the upper delay line 324.

Figure 15:
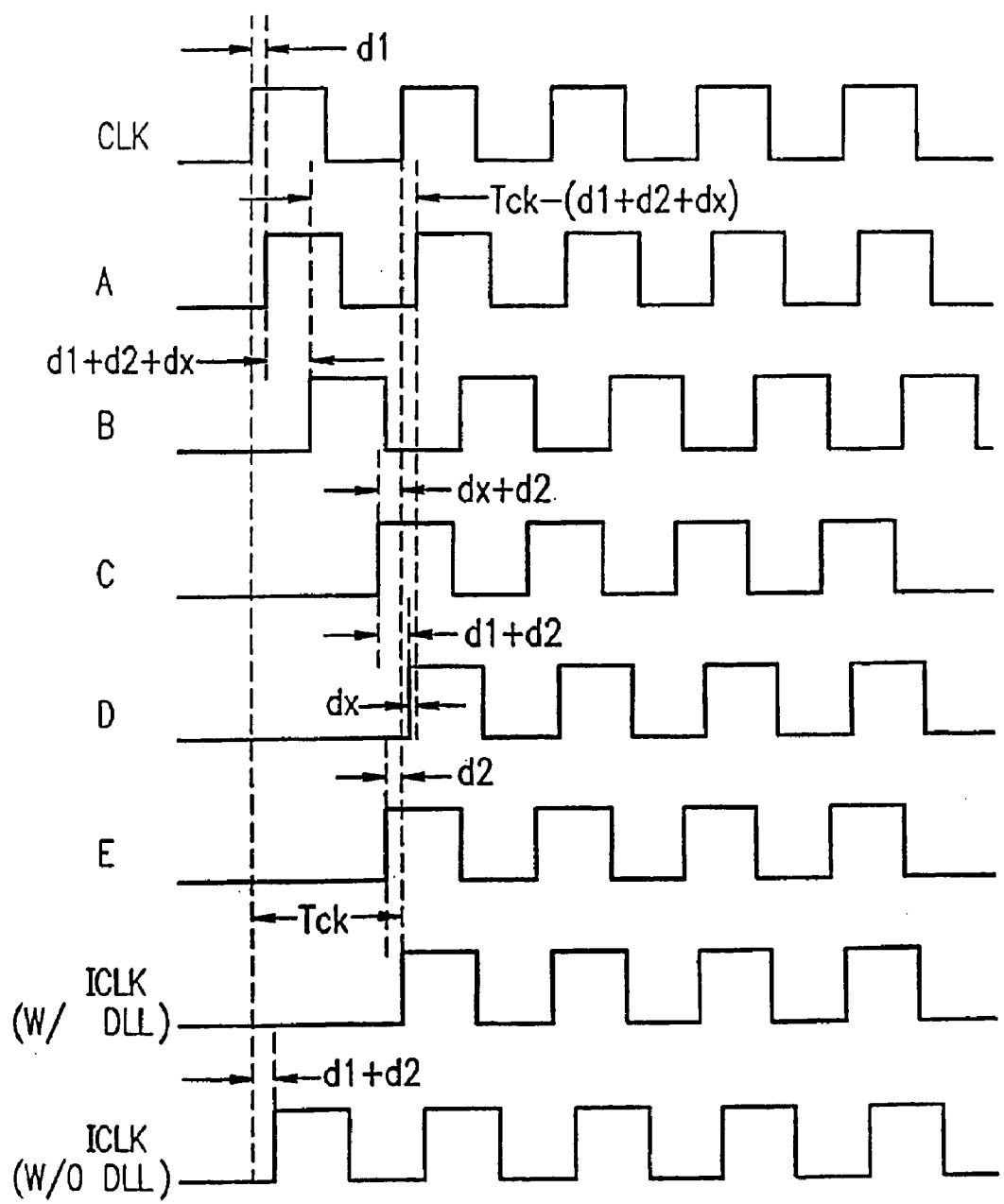
FIG. 15 is a timing diagram illustrating the timing of various signals in the circuit of FIG. 14.

The first and second delay circuits 321 and 322 delay the signal A by a total delay time of (d1+d2+dx), and apply the resultant signal B to the upper delay line 324. The upper delay line 324 sequentially transfers the signal B therethrough until the upper delay line 324 outputs one of signals b, c, d, e, f, g, h, and i to the lower delay line 326 responsive to the next rising edge of the signal A. The lower delay line 326 sequentially transfers the signal A therethrough and the lower delay line 326 outputs the signal C responsive to the one of signals b, c, d, e, f, g, h, and i. As a result, as shown in the timing chart of FIG. 15, the signal C is advanced with respect to the clock signal CLK by a time duration which is equal to (dx+d2).

The second timing compensation section 313 includes a delay circuit 331, an upper delay line 333 including a plurality of delay circuits 332 having a relatively short delay time, and a lower delay line 335 including a plurality of delay circuits 334 having the same relatively short delay time as the upper delay line 333. The delay circuit 331 delays the signal C by a delay time (d1+d2), and applies the resultant signal D to the upper delay line 333. The upper delay line 333 sequentially transfers the signal D therethrough until the upper delay line 333 outputs one of signals b, c, d, e, f, g, h, and i to the lower delay line 335 responsive to the next rising edge of the signal A. The lower delay line 335 sequentially transfers the signal C therethrough and the lower delay line 335 outputs the signal E responsive to the one of signals b, c, d, e, f, g, h, and i. As a result, as shown in the timing chart of FIG. 15, the signal E is advanced with respect to the clock signal CLK by a time duration which is equal to d2.

The signal E is delayed in the output buffer 314 by the delay time d2 before being output as the clock signal ICLK. As a result, the clock signal ICLK is output, which is synchronized with the input clock signal CLK.

According to the present example, the delay circuits within the upper and lower delay lines 324 and 326 in the first timing compensation section 312 have a relatively long delay time, whereas the delay circuits within the upper and lower delay lines 333 and 335 in the second timing compensation section 313 have a relatively short delay time. The delay time dx in the second delay circuit 322 is provided for adjustment purposes to ensure that the signal C is received by the second timing compensation section 313 before the signal E is received by the output buffer 314. The second timing compensation section 313 can only delay, and not advance, the signal C by using the delay time dx. Thus, the second timing compensation section 313 will utilize the delay time dx in order to ensure that the signal C is received by the second timing compensation section 313 before the signal E is received by the output buffer 314. The method for determining the delay time dx may be the same as that described in Example 4.

According to the present example, the upper and lower delay lines 324 and 326 in the first timing compensation section 312 advance the signal C with respect to the clock signal CLK by a time duration (dx+d2). The timing of the signal C can only be coarsely adjusted with a resolution which corresponds to the relatively long delay time of each delay circuit within the upper and lower delay lines 324 and 326 in the first timing compensation section 312. However, the relatively long delay time provided by the upper and lower delay lines 324 and 326 in the first timing compensation section 312 make it possible to achieve a broad range of delay time adjustment with a minimum occupied area of (i.e. a minimum number of delay circuits within) the upper and lower delay lines 324 and 326. On the other hand, the timing of the signal E can be more precisely adjusted, with a resolution which corresponds to the relatively short delay time of each delay circuit within the upper and lower delay lines 333 and 335 in the second timing compensation section 313 (which are employed for final adjustment of the delay times). The upper and lower delay lines 333 and 335 in the second timing compensation section 313 only need to provide a small adjustment range for the delay time of the signal E because the upper and lower delay lines 324 and 326 in the first timing compensation section 312 have already adjusted the delay time of the signal C so that there is only a small difference, if any, between the actual delay time of the signal C and the target delay time thereof. Consequently, the upper and lower delay lines 333 and 335 in the second timing compensation section 313 are also prevented from occupying an excessive area.

EXAMPLE 6

Figure 16:
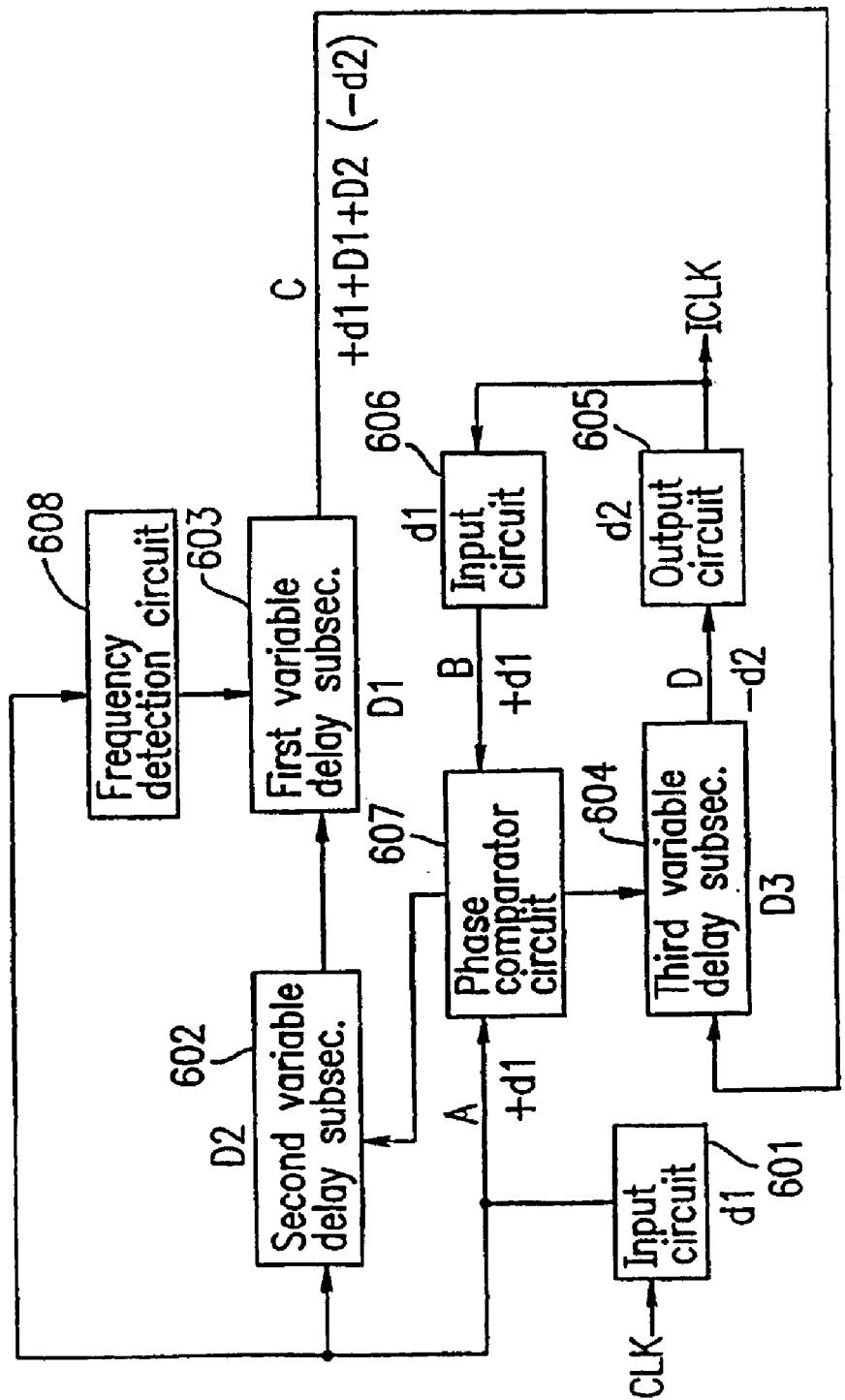
FIG. 16 is a block diagram illustrating a timing generation circuit according to Example 6 of the present invention.

FIG. 16 is a block diagram illustrating a timing generation circuit according to Example 6 of the present invention. With reference to FIG. 16, an input circuit 601 receives a clock signal CLK and generates a signal A by delaying the clock signal CLK by a delay time d1. A second variable delay subsection 602 receives the signal A and generates a signal which is further delayed by a delay time D2. A first variable delay subsection 603 receives this signal from the second variable delay subsection 602 and generates a signal C which is further delayed by a delay time D1. A third variable delay subsection 604 receives the signal C and generates a signal D by further delaying the signal C by a delay time D3. An output circuit 605 receives the signal D and generates a clock signal ICLK by further delaying the signal D by a delay time d2. The clock signal ICLK is output, which is synchronized with the input clock signal CLK.

A dummy input circuit 606 receives the clock signal ICLK and outputs a signal B which is further delayed by the delay time d1. A phase comparator circuit 607 receives the signals A and B, and adjusts the delay time D2 in the second variable delay subsection 602 so that the signals A and B are synchronized with each other.

A frequency detection circuit 608, which receives the signal A and detects the frequency of the signal A (i.e., the clock signal frequency), increases the delay time D1 of the first variable delay subsection 603 as the detected clock frequency decreases. As a result, the signal C which is output from the first variable delay subsection 603 is advanced by a time duration d2 with respect to the clock signal CLK. Thereafter, the delay time D1 of the first variable delay subsection 603 is locked.

The phase comparator circuit 607 receives the signals A and B, and adjusts the delay time D3 in the third variable delay subsection 604 so that the signals A and B are synchronized with each other. As a result, the signal D which is output from the third variable delay subsection 604 is delayed by a delay time −d2 (i.e., advanced by the time duration d2) with respect to the clock signal CLK, and thereafter is further delayed by the delay time d2 in the output circuit 605. Thus, the clock signal ICLK which is output from the output circuit 605 is synchronized with the input clock signal CLK.

According to the present example, each delay circuit within the first variable delay subsection 603 has a long delay time, whereas each delay circuit within the second and third variable delay subsections 602 and 604 has a short delay time. When the delay time D1 in the first variable delay subsection 603 is to be adjusted in accordance with the frequency of the signal A, the delay time D2 in the second variable delay subsection 602 is set at its maximum value. Since each delay circuit within the first variable delay subsection 603 has a long delay time, the first variable delay subsection 603 is not capable of highly accurate adjustment, but is followed up by the fine adjustment in the second and third variable delay subsections 602 and 604. For comparison, in Example 3, it was necessary to ensure that the signal (C) from the first variable delay subsection arrives at the second variable delay subsection before the signal (D) having a delay time of −d2 is issued because the timing generation circuit of Example 3 lacks an element corresponding to the second variable delay subsection 602 according to the present example.

In contrast, according to the present example, the arrival of the signal C output from the first variable delay subsection 603 only needs to occur closely before or closely after the issuance of the signal D having a delay time of −d2. If the arrival of the signal C occurs before the issuance of the signal D having a delay time of −d2, the signal D is delayed by the third variable delay subsection 604. If the arrival of the signal C occurs after the issuance of the signal D having a delay time of −d2, the delay time of the signal C is adjusted by reducing the delay time D2 in the second variable delay subsection 602 (note that the delay time D2 in the second variable delay subsection 602 was set at its maximum value when adjusting the delay time D1 in the first variable delay subsection 603). The second and third variable delay subsections 602 and 604 are capable of accurate adjustment based on the relatively short delay time of each delay circuit within the second and third variable delay subsections 602 and 604. Since a coarse adjustment is performed by the first variable delay subsection 603, the second and third variable delay subsections 602 and 604 only need to provide a small adjustment range of delay time. As a result, it is possible to minimize the number of delay circuits within the second and third variable delay subsections 602 and 604, and hence minimize the area occupied by the second and third variable delay subsections 602 and 604.

EXAMPLE 7

Figure 17:
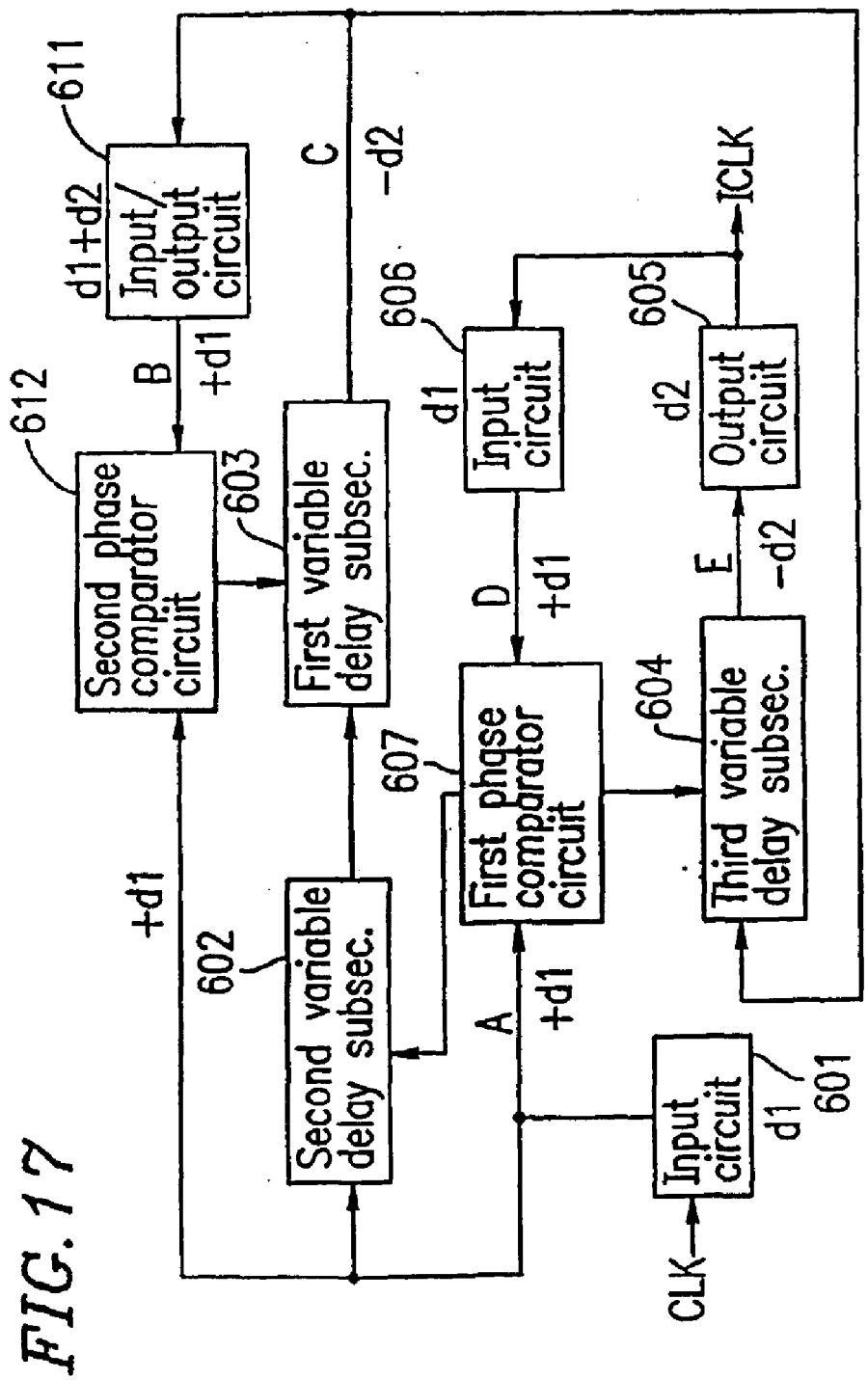
FIG. 17 is a block diagram illustrating a timing generation circuit according to Example 7 of the present invention.
Figure 18:
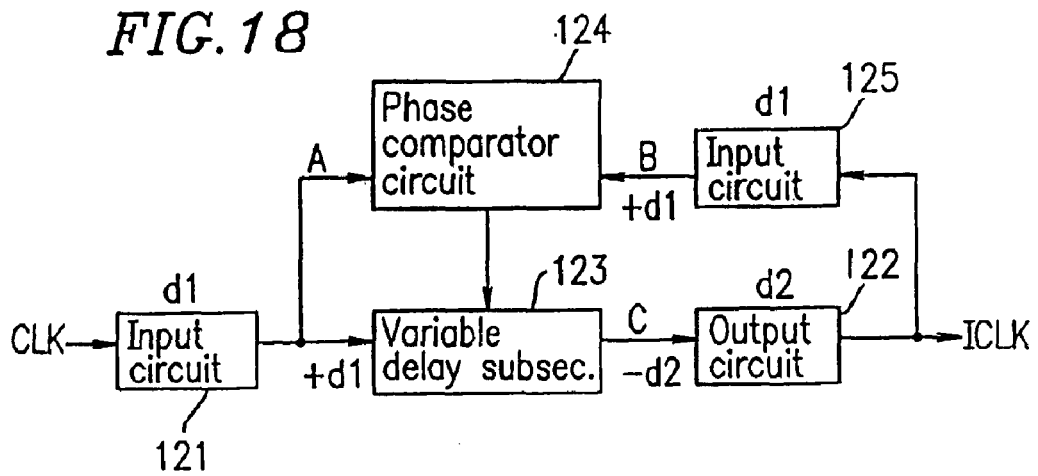
FIG. 18 is a block diagram illustrating another conventional timing generation circuit.

FIG. 17 is a block diagram illustrating a timing generation circuit according to Example 7 of the present invention. According to the present example, a dummy input/output circuit 611 and a second phase comparator circuit 612 are inserted instead of the frequency detection circuit 608 shown in FIG. 16. In FIG. 17, the component elements which also appear in FIG. 16 are denoted by the same numerals as used therein.

A dummy input/output circuit 611 receives a signal C from a first variable delay subsection 603 and generates a signal B by further delaying the signal C by a delay time (d1+d2), and outputs the signal B. The second phase comparator circuit 612 receives the signals A and B, and adjusts a delay time D1 in the first variable delay subsection 603 so that the signals A and B are synchronized with each other. As a result, the signal C which is output from the first variable delay subsection 603 is advanced approximately by a time duration d2 with respect to the clock signal CLK. The delay adjustment in the first variable delay subsection 603 only needs to attain a certain level of accuracy within the adjustment capability of the first variable delay subsection 603. Thereafter, the first variable delay subsection 603 is locked.

According to the present example, too, the arrival of the signal C output from the first variable delay subsection 603 only needs to occur closely before or closely after the issuance of a signal E having a delay time of −d2. The second and third variable delay subsections 602 and 604 are capable of accurate adjustment based on the relatively short delay time of each delay circuit within the second and third variable delay subsections 602 and 604. Since a coarse adjustment is performed by the first variable delay subsection 603, the second and third variable delay subsections 602 and 604 only need to provide a small adjustment range of delay time. As a result, it is possible to minimize the number of delay circuits within the second and third variable delay subsections 602 and 604, and hence minimize the area occupied by the second and third variable delay subsections 602 and 604.

In Examples 4 to 7 above, the lowest frequency of the input clock signal can be further lowered by arranging the timing generation circuit so that the delay time of each delay circuit within the first variable delay subsection can be changed in accordance with the clock signal frequency, as in Example 3. As a result, the frequency range of the clock signal that can be properly processed by the timing generate circuit according to the present example can be broadened.

The above examples are only illustrative, and in no way restrictive of the scope of invention. Various modifications would be apparent to those skilled in the art. For example, the number of delay circuits in any given section may be increased or decreased. A wider variety of delay times may be employed. It is also applicable to allocate different delay times to respective delay circuits and adjust the delay time of at least one delay circuit. Although the above-described operations are all illustrated to occur responsive to rising edges of various signals, they may alternatively be arranged to occur responsive to falling edges of various signals.

As described above, according to the present invention, the delay time of at least one of the delay circuits in a delay section (which may include various delay subsections) is changed in accordance with the frequency of an input clock signal, thereby adjusting the maximum delay time provided by the delay section. As a result, the synchronization of the clock signal can be adjusted irrespective of the clock signal frequency. For example, as the clock signal frequency decreases (i.e., as the clock signal has a longer cycle), the delay time of at least one of the delay circuits in the delay section may be increased so that the maximum delay time of the entire delay section becomes longer than the clock signal cycle.

In one embodiment of the invention, the delay time in each one of the former delay circuits in a delay section is variable and the delay time in each one of the latter delay circuits in the delay section is prescribed at a short value. Thus, the delay time in each one of the former delay circuits is changed so that the clock signal is output from one of the latter delay circuits, thereby adjusting the maximum delay time of the entire delay section. Since each one of the latter delay circuits in the delay section has a relatively short delay time, it becomes possible to highly accurately adjust the timing of outputting (and hence synchronization of) the clock signal by ensuring that the clock signal is output from one of the latter delay circuits. As a result, the synchronization of the clock signal can be adjusted irrespective of the clock signal frequency, even under constraints on the number of delay circuits.

In another embodiment of the invention, the delay section may include a plurality of delay subsections having respectively different delay times, so that one of the delay subsections may perform a coarse adjustment of the delay time whilst another delay subsection may perform a finer adjustment of the delay time.

In that case, the delay subsection for performing a coarse adjustment of the delay time provides an advantage in that a long total delay time can be provided with a minimum occupied area. The delay subsection for performing a finer adjustment of the delay time provides the advantage of precise delay time adjustment. By combining these two types of delay subsections, it is possible to first coarsely, and therefore quickly, adjust the delay time for a clock signal with the coarse adjustment delay subsection, and then more precisely adjust the delay time for the clock signal with the fine adjustment delay subsection, even if the clock signal frequency drastically fluctuates over a wide range of frequencies. In other words, the principles of the present invention make it possible to adopt a delay subsection having a short delay time without losing the ability of adjusting the synchronization of a clock signal having a long cycle.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A timing generation circuit, comprising a delay section for delaying a clock signal by a predetermined amount of time before the clock signal is output,
wherein the delay section comprises:
a first delay subsection having a relatively long delay time for performing a coarse delay time adjustment;
a second delay subsection having a relatively short delay time for performing a finer delay time adjustment;
a third delay subsection for performing a finest delay time adjustment; and
a frequency detection circuit for adjusting the relatively long delay time of the first delay subsection based on a frequency of the clock signal, wherein the frequency detection circuit approximating a target delay time based on the frequency of the clock signal.

2. A timing generation circuit according to claim 1, further comprising
a phase comparator circuit for adjusting the relatively short delay time of the second delay subsection based on a phase shift of the clock signal.

3. A timing generation circuit according to claim 1, further comprising
a phase comparator circuit for adjusting the relatively short delay time of the second delay subsection so as to equal the target delay time based on a phase shift of the clock signal.

4. A timing generation circuit according to claim 1,
wherein the first delay subsection is provided adjacent to an input node for inputting the clock signal, and the second delay subsection is provided adjacent to an output node for outputting the clock signal.

5. A timing generation circuit according to claim 1,
wherein the first delay subsection includes a plurality of delay circuits for sequentially transferring the clock signal there through, and the second delay subsection includes a plurality of delay circuits for sequentially transferring the clock signal there through,
wherein the clock signal which is output from either the first delay subsection or the second delay subsection is output from the timing generation circuit.

6. A timing generation circuit, comprising a delay section for delaying a clock signal by a predetermined amount of time before the clock signal is output,
wherein the delay section comprises a plurality of delay subsections having respectively different delay times,
wherein at least one of the plurality of delay subsections performs a coarse delay time adjustment, and at least one of the plurality of delays performs a finer delay time adjustment,
wherein the timing generation circuit further comprises a frequency detection circuit for adjusting the delay time of the at least one delay subsection for performing a coarse delay time adjustment,
wherein the frequency detection circuit for adjusting the relatively long delay time of the first delay subsection approximates a target delay time based on the frequency of the clock signal,
wherein the delay section includes at least three delay subsections, and
wherein the at least three delay subsections respectively perform different levels of delay time adjustment, comprising a coarse delay time adjustment, a finer delay time adjustment, and a finest delay time adjustment.

7. A timing generation circuit according to claim 6, further comprising
a phase comparator circuit for adjusting the delay time of the at least one delay subsection for performing a finer delay time adjustment, based on a phase shift of the clock signal.

8. A timing generation circuit according to claim 6,
wherein the at least one delay subsection for performing a coarse delay time adjustment is provided adjacent to an input node for inputting the clock signal, and the at least one delay subsection for performing a finer delay time adjustment is provided adjacent to an output node for outputting the clock signal.

9. A timing generation circuit according to claim 6,
wherein each of the plurality of delay subsections includes a plurality of delay circuits for sequentially transferring the clock signal there through, and
wherein the clock signal which is output from one of the plurality of delay subsections is output from the timing generation circuit.

10. A timing generation circuit, comprising:
a delay section for delaying a clock signal by a predetermined amount of time before the clock signal is output, the delay section including:
a first delay subsection having a relatively long delay time for performing a coarse delay time adjustment;
a second delay subsections having a relatively short delay for performing a finer delay time adjustment;
a third delay subsection for performing a finest delay time adjustment;
a frequency detection circuit for adjusting the delay time of the first delay subsection based on a frequency of the clock signal, wherein the frequency detection circuit approximates a target delay time based on the frequency of the clock signal; and
a phase comparator circuit for adjusting the delay times of the second and third delay subsections based on a phase shift of the clock signal.

11. A timing generation circuit, comprising:
a delay section for delaying a clock signal by a predetermined amount of time before the clock signal is output, the delay section including:
a first delay subsection having a delay time for performing a coarse delay time adjustment;
second and third delay subsections having respective delay times for performing a finer delay time adjustment;
a first phase comparator circuit for adjusting the delay time of the first delay subsection based on a phase shift of the clock signal; and a second phase comparator circuit for adjusting the delay times of the second and third delay subsections based on the phase shift of the clock signal.

12. A timing generation circuit according to claim 10, wherein each of the plurality of delay subsections includes a plurality of delay circuits for sequentially transferring the clock signal there through, and
wherein the clock signal which is output from one of the plurality of delay subsections is output from the timing generation circuit.

13. A timing generation circuit according to claim 11,
wherein each of the plurality of delay subsections includes a plurality of delay circuits for sequentially transferring the clock signal there through, and
wherein the clock signal which is output from one of the plurality of delay subsections is output from the timing generation circuit.

14. A timing generation circuit according to claim 1,
wherein one of the delay subsections which has a smaller delay time than that of any other delay subsection is prescribed with a delay time equal to a shortest possible delay time permitted in an actual implementation of the timing generation circuit.

15. A timing generation circuit according to claim 6,
wherein one of the delay subsections which has a smaller delay time than that of any other delay subsection is prescribed with a delay time equal to a shortest possible delay time permitted in an actual implementation of the timing generation circuit.

16. A timing generation circuit according to claim 10,
wherein one of the delay subsections which has a smaller delay time than that of any other delay subsection is prescribed with a delay time equal to a shortest possible delay time permitted in an actual implementation of the timing generation circuit.

17. A timing generation circuit according to claim 11,
wherein one of the delay subsections which has a smaller delay time than that of any other delay subsection is prescribed with a delay time equal to a shortest possible delay time permitted in an actual implementation of the timing generation circuit.

18. A timing generation circuit according to claim 11,
wherein characteristics of components of the delay section are optimized so that the delay section is capable of providing an increased delay time without increasing areas occupied by the plurality of delay circuits.

19. A timing generation circuit according to claim 1,
wherein the delay section provides a variable delay time.

20. A timing generation circuit according to claim 6,
wherein the delay section provides a variable delay time.

21. A timing generation circuit according to claim 10,
wherein the delay section provides a variable delay time.

22. A timing generation circuit according to claim 11,
wherein the delay section provides a variable delay time.

23. A timing generation circuit according to claim 1,
wherein a rising or falling edge of the clock signal which has been subjected to the coarse delay time adjustment occurs before a target time, and the rising or falling edge of the clock signal is adjusted through the finer delay time adjustment so as to occur at the target time.

24. A timing generation circuit according to claim 6,
wherein a rising or falling edge of the clock signal which has been subjected to the coarse delay time adjustment occurs before a target time, and the rising or falling edge of the clock signal is adjusted through the finer delay time adjustment so as to occur at the target time.

25. A timing generation circuit according to claim 23,
wherein the delay times of the respective delay subsections are prescribed, while taking into consideration any errors in the delay times provided by the respective delay subsections, so that a rising or falling edge of the clock signal which has been subjected to the coarse delay time adjustment occurs before the target time.

26. A timing generation circuit according to claim 24,
wherein the delay times of the respective delay subsections are prescribed, while taking into consideration any errors in the delay times provided by the respective delay subsections, so that a rising or falling edge of the clock signal which has been subjected to the coarse delay time adjustment occurs before the target time.

* * * * *